US009532044B2

(12) United States Patent
Shigenobu

(10) Patent No.: US 9,532,044 B2
(45) Date of Patent: Dec. 27, 2016

(54) ARITHMETIC DECODING DEVICE, IMAGE DECODING APPARATUS AND ARITHMETIC DECODING METHOD

(71) Applicant: PANASONIC CORPORATION, Osaka (JP)

(72) Inventor: Yuya Shigenobu, Nara (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 331 days.

(21) Appl. No.: 14/225,207

(22) Filed: Mar. 25, 2014

(65) Prior Publication Data

US 2014/0205010 A1    Jul. 24, 2014

Related U.S. Application Data

(63) Continuation of application No. PCT/JP2012/004192, filed on Jun. 28, 2012.

(30) Foreign Application Priority Data

Sep. 29, 2011  (JP) .................................. 2011-215541

(51) Int. Cl.
*H04N 19/13*    (2014.01)
*H03M 7/40*    (2006.01)
(Continued)

(52) U.S. Cl.
CPC ..... *H04N 19/00121* (2013.01); *H03M 7/4018* (2013.01); *H04N 19/436* (2014.11);
(Continued)

(58) Field of Classification Search
CPC .............. H03M 7/4018; H03M 7/6029; H04N 19/00121; H04N 19/436; H04N 19/61; H04N 19/91
(Continued)

(56) References Cited

U.S. PATENT DOCUMENTS 7,197,190 B1 * 3/2007 Andrew ............... H04N 19/176
                                                        375/E7.047
7,528,749 B2    5/2009 Otsuka
(Continued)

FOREIGN PATENT DOCUMENTS

JP    2007-074648 A    3/2007
JP    2008-118304 A    5/2008
(Continued)

OTHER PUBLICATIONS

JP2008311803MT, English Translation of the Japanese document [JP2008311803A] can be downloaded from JPO web sites, Dec. 25, 2008.*
(Continued)

*Primary Examiner* — Shan Elahi
(74) *Attorney, Agent, or Firm* — McDermott Will & Emery LLP

(57) ABSTRACT

An arithmetic decoding device includes a calculating unit that calculates candidates for split information using probability information, the split information indicating a boundary between a first value range and a second value range in range information, the probability information indicating whether a next item of binary data takes the first or second value, and the range information indicating a possible range of positional information obtained from a stream; a selecting unit that selects the split information corresponding to the range information from among the candidates; and a generating unit that generates the binary data according to which range of the range information divided at the split information includes the positional information and generates a next piece of the range information and a next piece of the positional information using the generated binary data. A process of the calculating unit and that of the generating unit are pipelined.

19 Claims, 26 Drawing Sheets

(51) Int. Cl.
*H04N 19/91* (2014.01)
*H04N 19/436* (2014.01)
*H03M 7/30* (2006.01)
*H04N 19/61* (2014.01)

(52) U.S. Cl.
CPC .......... *H04N 19/91* (2014.11); *H03M 7/6029* (2013.01); *H04N 19/61* (2014.11)

(58) Field of Classification Search
USPC .................................................. 375/240.12
See application file for complete search history.

(56) References Cited

U.S. PATENT DOCUMENTS

| | | | |
|---|---|---|---|
| 7,876,240 B2 | 1/2011 | Le Lann et al. | |
| 8,018,996 B2 | 9/2011 | Chiba | |
| 8,326,075 B2* | 12/2012 | Wilkins | H04N 19/50 358/426.01 |
| 8,897,591 B2* | 11/2014 | Wilkins | H04N 19/50 358/426.01 |
| 2002/0150158 A1* | 10/2002 | Wu | H04N 19/34 375/240.12 |
| 2002/0152369 A1* | 10/2002 | Wise | G06F 9/3867 712/300 |
| 2004/0059770 A1* | 3/2004 | Bossen | H03M 7/4006 708/530 |
| 2006/0017591 A1* | 1/2006 | Bossen | H03M 7/40 341/50 |
| 2008/0100479 A1* | 5/2008 | Otsuka | H03M 7/4006 341/60 |
| 2009/0219177 A1 | 9/2009 | Le Lann et al. | |
| 2009/0232205 A1 | 9/2009 | Chiba | |
| 2011/0216834 A1* | 9/2011 | Zhou | H04N 7/12 375/240.24 |
| 2011/0248872 A1* | 10/2011 | Korodi | H03M 7/40 341/67 |
| 2011/0317769 A1* | 12/2011 | Tanaka | H03M 7/4006 375/240.24 |
| 2012/0014433 A1* | 1/2012 | Karczewicz | H03M 7/40 375/240.02 |
| 2012/0082215 A1* | 4/2012 | Sze | H04N 19/436 375/240.03 |
| 2012/0082231 A1* | 4/2012 | Rojals | H04N 19/176 375/240.18 |
| 2012/0163452 A1* | 6/2012 | Horowitz | H04N 19/137 375/240.12 |
| 2012/0163453 A1* | 6/2012 | Horowitz | H04N 19/137 375/240.12 |
| 2012/0177108 A1* | 7/2012 | Joshi | G06F 17/147 375/240.03 |
| 2012/0194363 A1* | 8/2012 | Korodi | H03M 7/40 341/87 |
| 2012/0328028 A1* | 12/2012 | Sadafale | H04N 19/159 375/240.24 |
| 2013/0027230 A1* | 1/2013 | Marpe | H03M 7/4006 341/107 |
| 2013/0051454 A1* | 2/2013 | Sze | H04N 19/70 375/240.02 |
| 2013/0101033 A1* | 4/2013 | Joshi | H03M 7/3068 375/240.12 |
| 2013/0117270 A1* | 5/2013 | Sullivan | H04N 19/44 707/740 |
| 2013/0188688 A1* | 7/2013 | Panusopone | H04N 19/13 375/240.02 |
| 2013/0202026 A1* | 8/2013 | Fang | H04N 19/91 375/240.02 |
| 2013/0223542 A1* | 8/2013 | Kim | H04N 19/91 375/240.29 |
| 2014/0226719 A1* | 8/2014 | Yamamoto | H04N 19/0006 375/240.12 |
| 2015/0281728 A1* | 10/2015 | Karczewicz | H04N 19/93 375/240.16 |

FOREIGN PATENT DOCUMENTS

| | | | |
|---|---|---|---|
| JP | 2008-289125 A | 11/2008 | |
| JP | 2008-311803 A | 12/2008 | |
| JP | 2008311803 A * | 12/2008 | .............. H04N 7/26 |
| JP | 2009-534886 A | 9/2009 | |
| WO | 2007/118811 A2 | 10/2007 | |

OTHER PUBLICATIONS

Pin-Chih Lin et al., "A Branch Selection Multi-Symbol High Throughput CABAC Decoder Architecture for H. 264/AVC," Circuits and Systems, 2009, ISCAS 2009, IEEE International Symposium on, May 2009, pp. 365-268.

International Search Report issued in International Application No. PCT/JP2012/004192 with Date of mailing Sep. 18, 2012, with English Translation.

\* cited by examiner

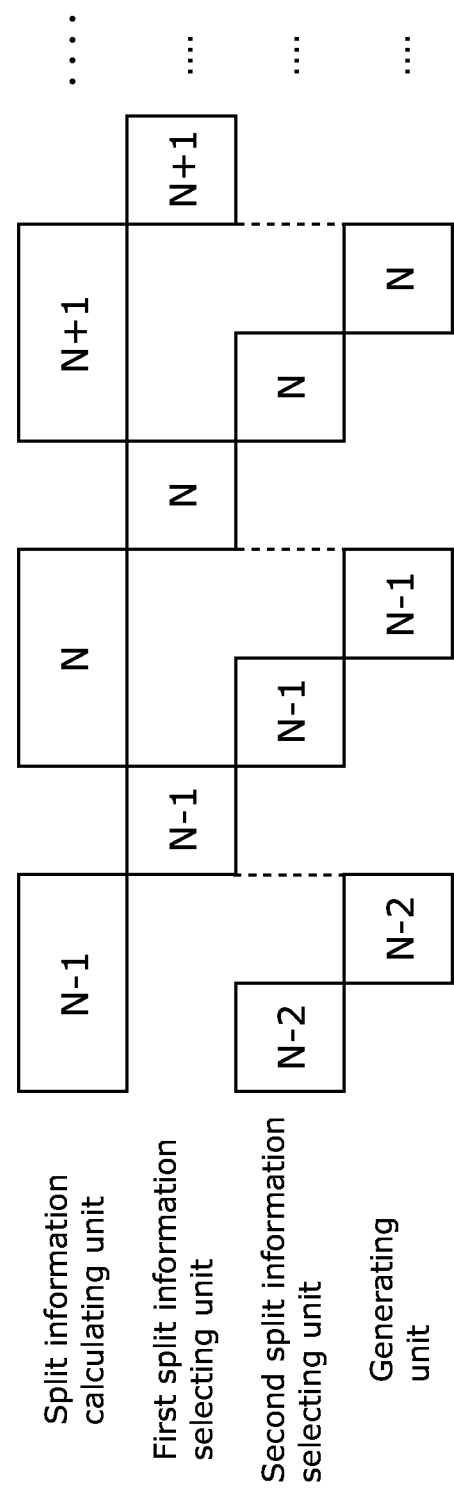

ARITHMETIC DECODING DEVICE, IMAGE DECODING APPARATUS AND ARITHMETIC DECODING METHOD

CROSS REFERENCE TO RELATED APPLICATION

This is a continuation application of PCT International Application No. PCT/JP2012/004192 filed on Jun. 28, 2012, designating the United States of America, which is based on and claims priority of Japanese Patent Application No. 2011-215541 filed on Sep. 29, 2011. The entire disclosures of the above-identified applications, including the specifications, drawings and claims are incorporated herein by reference in their entirety.

FIELD

The present disclosure relates to an arithmetic decoding device and an arithmetic decoding method.

BACKGROUND

In recent years, compression encoding technologies for moving pictures and sound have made remarkable progress and been put into practice in the fields such as broadcasting, communications and accumulation. Entropy encoding is one of the compression encoding technologies, in which a code length is varied according to an occurrence probability of a value to be encoded, thus improving an encoding efficiency. Specific examples of the known entropy encoding include Huffman encoding, arithmetic encoding and so on.

As the arithmetic encoding system, CABAC (Context-based Adaptive Binary Arithmetic Coding) that is adopted in H.264/AVC has been known, for example. The CABAC encoding is divided mainly into a probability information calculating process and a binary arithmetic encoding process.

In the probability information calculating process, according to SE (Syntax Element) to which binary data to be encoded belongs, binIdx (the location of binary data in a sequence of binary data making up SE) and a context, ctxIdx (a number specifying the probability information of the binary data) is calculated, followed by referring to and updating the probability information of the binary data specified by ctxIdx. A plurality of pieces of the probability information of the binary data are held as MPS (Most Probable Symbol: 0 or 1 having a higher occurrence probability) and pStateIdx (a number specifying an occurrence probability table).

FIG. 14 is a conceptual diagram for describing the binary arithmetic encoding process. In the binary arithmetic encoding process, a range is narrowed down between real numbers 0.0 and 1.0 according to the occurrence probability table specified by pStateIdx. The encoded data is obtained as binary expressions of real numbers specifying a final range. In practice, because a range width is secured with a limited number of digits, a process called Renormalization is added, in which, once a high-order bit in the final range is confirmed, the encoded data is outputted to broaden the range width.

The CABAC decoding is divided mainly into a probability information calculating process and a binary arithmetic decoding process. In the probability information calculating process, according to SE to which binary data to be decoded belongs, binIdx and a context, ctxIdx is calculated, followed by referring to and updating the probability information of the binary data specified by ctxIdx. A plurality of pieces of the probability information of the binary data are held as MPS and pStateIdx.

FIG. 15 is a conceptual diagram for describing the binary arithmetic decoding process. In the binary arithmetic decoding process, a range is divided into an MPS range and an LPS (Least Probable Symbol: 0 or 1 having a lower occurrence probability) range according to the occurrence probability table specified by pStateIdx. Then, based on which range includes the encoded data specifying the final range, binary data is confirmed. In practice, because a range width is secured with a limited number of digits, a process called Renormalization is added, in which, once a high-order bit in the final range is confirmed, the encoded data is read on to broaden the range width.

In the CABAC decoding, until binary data to be decoded currently is confirmed, SE to which binary data to be decoded next belongs, binIdx and the context are not confirmed. Thus, ctxIdx cannot be calculated. This makes it necessary to sequentially execute the probability information calculating process and the binary arithmetic decoding process, so that speedups are not possible.

Patent Literature (PTL) 1 discloses one method for solving this problem. In a conventional arithmetic decoding device described in PTL 1, the probability information calculating process is divided into a ctxIdx calculating process and an MPS and pStateIdx outputting process, thus pipelining the ctxIdx calculating process corresponding to next-next binary data, the MPS and pStateIdx outputting process corresponding to next binary data and the binary arithmetic decoding process corresponding to current binary data.

In the ctxIdx calculating process, ctxIdx candidates corresponding to the combinations of all the possible values of the current binary data and the next binary data are calculated. Then, once the current binary data is confirmed, ctxIdx candidates corresponding to the next-next binary data are selected. More specifically, four kinds of ctxIdx candidates satisfying (current binary data, next binary data)=(0, 0), (0, 1), (1, 0), (1, 1) are calculated. Then, once the current binary data is confirmed, two kinds of ctxIdx candidates satisfying either (current binary data, next binary data)=(0, 0), (0, 1) or (current binary data, next binary data)=(1, 0), (1, 1) are selected.

In the MPS and pStateIdx outputting process, MPS and pStateIdx candidates corresponding to the ctxIdx candidates calculated in the ctxIdx calculating process are outputted. Then, once the current binary data is confirmed, MPS and pStateIdx corresponding to the next binary data are selected. More specifically, two kinds of MPS and pStateIdx candidates having a current binary data=0, 1 are outputted, and once the current binary data is confirmed, either MPS or pStateIdx is selected.

On the other hand, the binary arithmetic decoding process confirms the current binary data according to the MPS and pStateIdx outputted by the MPS and pStateIdx outputting process.

This makes it possible to pipeline the probability information calculating process and the binary arithmetic decoding process, which have had to be executed sequentially, so that the speed of CABAC decoding can be enhanced.

CITATION LIST

Patent Literature

[PTL 1] Japanese Unexamined Patent Application Publication No. 2008-289125

SUMMARY

Technical Problem

However, the conventional arithmetic decoding device described above has a problem in that processes in the binary arithmetic decoding process cannot be pipelined, although it is possible to pipeline the probability information calculating process and the binary arithmetic decoding process and pipeline processes in the probability information calculating process. Thus, in an arithmetic encoding system that requires a long processing time for the binary arithmetic decoding process, a pipelining time is governed by the processing time for the binary arithmetic decoding process, so that the speed of the entire arithmetic decoding process cannot be enhanced.

Solution to Problem

Accordingly, for solving the conventional problem described above, one non-limiting and explanatory embodiment provides an arithmetic decoding device capable of pipelining individual processes in the binary arithmetic decoding process.

In order to solve the foregoing problems, an arithmetic decoding device according to one embodiment of the present disclosure is an arithmetic decoding device that decodes an arithmetically encoded stream to generate binary data. More specifically, the arithmetic decoding device includes a split information calculating unit which calculates candidates for split information using probability information, the split information indicating a boundary between a range of a first value and a range of a second value in range information, the probability information indicating whether a next item of the binary data takes the first value or the second value, and the range information indicating a possible range of positional information obtained from the stream; a split information selecting unit which selects the split information corresponding to the range information from among the candidates for the split information; and a generating unit which generates the binary data according to which range of the range information divided at the split information includes the positional information and generates a next piece of the range information and a next piece of the positional information using the generated binary data. A process of the split information calculating unit and a process of the generating unit are pipelined.

In this way, in the arithmetic encoding system where an appearance probability of next binary data is determined independently of binary data, it becomes possible to pipeline a split information calculating process and a binary data calculating process while decoding one item of the binary data per cycle. As a result, the speed of the binary arithmetic decoding process can be enhanced.

Additionally, the arithmetic decoding device may further include a split information storing unit which stores the candidates for the split information that are calculated by the split information calculating unit; a range information storing unit which stores the range information that is generated by the generating unit; and a positional information storing unit which stores the positional information that is generated by the generating unit. The split information selecting unit may select an nth piece of the split information corresponding to an nth piece of the range information stored in the range information storing unit from among the candidates for the nth piece of the split information stored in the split information storing unit and notify the generating unit of the nth piece of the split information. The generating unit may generate an nth item of the binary data, an (n+1)th piece of the range information and an (n+1)th piece of the positional information using the nth piece of the split information of which the split information selecting unit has notified the generating unit, the nth piece of the range information stored in the range information storing unit and an nth piece of the positional information stored in the positional information storing unit.

Moreover, the arithmetic decoding device may further include a split information storing unit which stores the split information that is selected by the split information selecting unit; a range information storing unit which stores the range information that is generated by the generating unit; and a positional information storing unit which stores the positional information that is generated by the generating unit. The split information selecting unit may select an nth piece of the split information corresponding to an nth piece of the range information stored in the range information storing unit from among the candidates for the nth piece of the split information calculated by the split information calculating unit and cause the split information storing unit to store the nth piece of the split information. The generating unit may generate an nth item of the binary data, an (n+1)th piece of the range information and an (n+1)th piece of the positional information using the nth piece of the split information stored in the split information storing unit, the nth piece of the range information stored in the range information storing unit and an nth piece of the positional information stored in the positional information storing unit.

In this way, since only one split information storing unit needs to be provided, it is possible to reduce necessary resources.

Also, the split information calculating unit may calculate the candidates for the split information, using the probability information when an immediately preceding item of the binary data takes the first value and the probability information when the immediately preceding item of the binary data takes the second value. The split information selecting unit may select the split information corresponding to the range information from among the split information calculated using the probability information corresponding to the immediately preceding item of the binary data generated by the generating unit.

In this way, in the arithmetic encoding system where an appearance probability of next binary data is determined depending on binary data, it becomes possible to pipeline a split information calculating process and a binary data calculating process while decoding one item of the binary data per cycle. As a result, the speed of the binary arithmetic decoding process can be enhanced.

Moreover, the arithmetic decoding device may further include a split information storing unit which stores the candidates for the split information that are calculated by the split information calculating unit; a range information storing unit which stores the range information that is generated by the generating unit; a positional information storing unit which stores the positional information that is generated by the generating unit; and a binary data storing unit which stores the binary data that is generated by the generating unit. The split information selecting unit may select an nth piece of the split information corresponding to an (n−1)th item of the binary data stored in the binary data storing unit and an nth piece of the range information stored in the range information storing unit from among the candidates for the nth piece of the split information stored in the split information storing unit and notify the generating unit of the nth piece of the split information. The generating unit may generate an nth item of the binary data, an (n+1)th piece of the range information and an (n+1)th piece of the positional information using the nth piece of the split information of which the split information selecting unit has notified the generating unit, the nth piece of the range information stored in the range information storing unit and an nth piece of the positional information stored in the positional information storing unit.

Additionally, the arithmetic decoding device may further include a split information storing unit which stores the candidates for the split information; a range information storing unit which stores the range information that is generated by the generating unit; and a positional information storing unit which stores the positional information that is generated by the generating unit. The split information selecting unit may include a first split information selecting unit which selects the candidate for the split information corresponding to an (n−1)th item of the binary data generated by the generating unit from among the candidates for an nth piece of the split information calculated by the split information calculating unit and causes the split information storing unit to store the candidate, and a second split information selecting unit which selects the nth piece of the split information corresponding to an nth piece of the range information stored in the range information storing unit from among the candidates for the split information stored in the split information storing unit and notifies the generating unit of the nth piece of the split information. The generating unit may generate an nth item of the binary data, an (n+1)th piece of the range information and an (n+1)th piece of the positional information using the nth piece of the split information of which the second split information selecting unit has notified the generating unit, the nth piece of the range information stored in the range information storing unit and an nth piece of the positional information stored in the positional information storing unit.

In this way, since it is necessary to provide only as many split information storing units as corresponding ranges of range information, necessary resources can be reduced.

Also, the arithmetic decoding device may further include a split information storing unit which stores the candidates for the split information; a binary data storing unit which stores the binary data that is generated by the generating unit; a range information storing unit which stores the range information that is generated by the generating unit; and a positional information storing unit which stores the positional information that is generated by the generating unit. The split information selecting unit may include a first split information selecting unit which selects the candidate for the split information corresponding to an nth piece of the range information stored in the range information storing unit from among the candidates for an nth piece of the split information calculated by the split information calculating unit and causes the split information storing unit to store the candidate, and a second split information selecting unit which selects the nth piece of the split information corresponding to an (n−1)th item of the binary data stored in the binary data storing unit from among the candidates for the split information stored in the split information storing unit and notifies the generating unit of the nth piece of the split information. The generating unit may generate an nth item of the binary data, an (n+1)th piece of the range information and an (n+1)th piece of the positional information using the nth piece of the split information of which the second split information selecting unit has notified the generating unit, the nth piece of the range information stored in the range information storing unit and an nth piece of the positional information stored in the positional information storing unit.

In this way, since only two split information storing units need to be provided, it is possible to reduce necessary resources.

Moreover, the arithmetic decoding device may further include a split information storing unit which stores the split information; a range information storing unit which stores the range information that is generated by the generating unit; and a positional information storing unit which stores the positional information that is generated by the generating unit. The split information selecting unit may select an nth piece of the split information corresponding to an (n−1)th item of the binary data and an nth piece of the range information calculated by the split information calculating unit from among the candidates for the nth piece of the split information calculated by the split information calculating unit and cause the split information storing unit to store the nth piece of the split information. The generating unit may generate an nth item of the binary data, an (n+1)th piece of the range information and an (n+1)th piece of the positional information using the nth piece of the split information stored in the split information storing unit, the nth piece of the range information stored in the range information storing unit and an nth piece of the positional information stored in the positional information storing unit.

In this way, since only one split information storing unit needs to be provided, it is possible to reduce necessary resources.

Also, the split information calculating unit may calculate the candidates for the split information by referring to a look-up table, which holds probability information corresponding to a combination of the probability information and an upper limit of the range information.

Further, in the arithmetic decoding device, the split information calculating unit may include a plurality of split information calculating units. Each of the plurality of split information calculating units may calculate the candidates for the split information by referring to the look-up table in which the upper limit of the range information is fixed.

This makes it possible to simplify the split information calculating process.

Moreover, the split information calculating unit may calculate the candidates for the split information by a multiplication process of the probability information and an upper limit of the range information.

Further, in the arithmetic decoding device, the split information calculating unit may include a plurality of split information calculating units. Each of the plurality of split information calculating units may calculate the candidates for the split information by the multiplication process in which the upper limit of the range information is fixed.

This makes it possible to simplify the split information calculating process.

Also, the arithmetic decoding device may further include a probability information calculating unit which calculates the probability information used in the split information selecting unit.

In this way, in any arithmetic encoding systems, it is possible to pipeline the probability information calculating process and the binary arithmetic decoding process, pipeline processes in the probability information calculating process and pipeline processes in the binary arithmetic decoding process. As a result, the speed of the entire arithmetic decoding process can be enhanced.

An arithmetic decoding device according to another embodiment of the present disclosure decodes an arithmetically encoded stream to generate binary data. More specifically, the arithmetic decoding device includes a range information storing unit which stores range information indicating a possible range of positional information obtained from the stream; a positional information storing unit which stores the positional information; a binary data storing unit which stores the binary data; a split information storing unit which stores candidates for split information, the split information indicating a boundary between a range of a first value and a range of a second value in the range information; a split information calculating unit; a split information selecting unit; a binary data generating unit; and a range and positional information generating unit. The split information calculating unit calculates the candidates for the split information using probability information and causes the split information storing unit to store the candidates, the probability information indicating whether a next item of the binary data takes the first value or the second value. The split information selecting unit selects the split information corresponding to the range information stored in the range information storing unit from among the candidates for the split information stored in the split information storing unit and notifies the binary data generating unit of the selected split information. The binary data generating unit generates the binary data according to which range of the range information divided at the split information includes the positional information, using the split information of which the split information selecting unit has notified the binary data generating unit, the range information stored in the range information storing unit and the positional information stored in the positional information storing unit, and causes the binary data storing unit to store the binary data. The range and positional information generating unit generates the range information and the positional information using the binary data generated by the binary data generating unit and causes the range information storing unit and the positional information storing unit to store the range information and the positional information.

An arithmetic decoding device according to another embodiment of the present disclosure decodes an arithmetically encoded stream to generate binary data. More specifically, the arithmetic decoding device includes a range information storing unit which stores range information indicating a possible range of positional information obtained from the stream; a positional information storing unit which stores the positional information; a split information storing unit which stores candidates for split information, the split information indicating a boundary between a range of a first value and a range of a second value in the range information; a split information calculating unit; a first split information selecting unit; a second split information selecting unit; a binary data generating unit; and a range and positional information generating unit. The split information calculating unit calculates the candidates for the split information using probability information and notifies the first split information selecting unit of the candidates, the probability information indicating whether a next item of the binary data takes the first value or the second value. The first split information selecting unit selects the candidate for the split information corresponding to an immediately preceding item of the binary data generated by the binary data generating unit from among the candidates for the split information of which the split information calculating unit has notified the first split information selecting unit and causes the split information storing unit to store the candidate. The second split information selecting unit selects the split information corresponding to the range information stored in the range information storing unit from among the candidates for the split information stored in the split information storing unit and notifies the binary data generating unit of the selected split information. The binary data generating unit generates the binary data according to which range of the range information divided at the split information includes the positional information, using the split information of which the second split information selecting unit has notified the binary data generating unit, the range information stored in the range information storing unit and the positional information stored in the positional information storing unit, and notifies the first split information selecting unit of the binary data. The range and positional information generating unit generates the range information and the positional information using the binary data generated by the binary data generating unit and causes the range information storing unit and the positional information storing unit to store the range information and the positional information.

An arithmetic decoding device according to another embodiment of the present disclosure decodes an arithmetically encoded stream to generate binary data. More specifically, the arithmetic decoding device includes a range information storing unit which stores range information indicating a possible range of positional information obtained from the stream; a positional information storing unit which stores the positional information; a binary data storing unit which stores the binary data; a split information storing unit which stores candidates for split information, the split information indicating a boundary between a range of a first value and a range of a second value in the range information; a split information calculating unit; a first split information selecting unit; a second split information selecting unit; a binary data generating unit; and a range and positional information generating unit. The split information calculating unit calculates the candidates for the split information using probability information and notifies the first split information selecting unit of the candidates, the probability information indicating whether a next item of the binary data takes the first value or the second value. The first split information selecting unit selects the candidate for the split information corresponding to the range information stored in the range information storing unit from among the candidates for the split information of which the split information calculating unit has notified the first split information selecting unit and causes the split information storing unit to store the candidate. The second split information selecting unit selects the split information corresponding to the binary data stored in the binary data storing unit from among the candidates for the split information stored in the split information storing unit and notifies the binary data generating unit of the selected split information. The binary data generating unit generates the binary data according to which range of the range information divided at the split information includes the positional information, using the split information of which the second split information selecting unit has notified the binary data generating unit, the range information stored in the range information storing unit and the positional information stored in the positional information storing unit, and causes the binary data storing unit to store the binary data. The range and positional information generating unit generates the range information and the positional information using the binary data generated by the binary data generating unit and causes the range information storing unit and the positional information storing unit to store the range information and the positional information.

An image decoding apparatus according to one embodiment of the present disclosure is an apparatus that generates an image from binary data obtained by decoding an arithmetically encoded stream and includes the arithmetic decoding device described above.

An arithmetic decoding method according to one embodiment of the present disclosure is a method of decoding an arithmetically encoded stream to generate binary data. More specifically, the arithmetic decoding method includes calculating candidates for split information using probability information, the split information indicating a boundary between a range of a first value and a range of a second value in range information, the probability information indicating whether a next item of the binary data takes the first value or the second value, and the range information indicating a possible range of positional information obtained from the stream; selecting the split information corresponding to the range information from among the candidates for the split information; and generating the binary data according to which range of the range information divided at the split information includes the positional information, and a next piece of the range information and a next piece of the positional information using the generated binary data. The calculating and the generating are pipelined.

Advantageous Effects

In accordance with the present disclosure, it is possible to provide an arithmetic decoding device capable of pipelining a split information calculating process and a binary data generating process in a binary arithmetic decoding process.

BRIEF DESCRIPTION OF DRAWINGS

These and other objects, advantages and features of the invention will become apparent from the following description thereof taken in conjunction with the accompanying drawings that illustrate a specific embodiment of the present disclosure.

FIG. 9C is a timing chart showing operation timing of individual structural components in FIG. 8.

DESCRIPTION OF EMBODIMENTS

The following is a detailed description of embodiments of the present disclosure, with reference to accompanying drawings.

Embodiment 1

Figure 1:
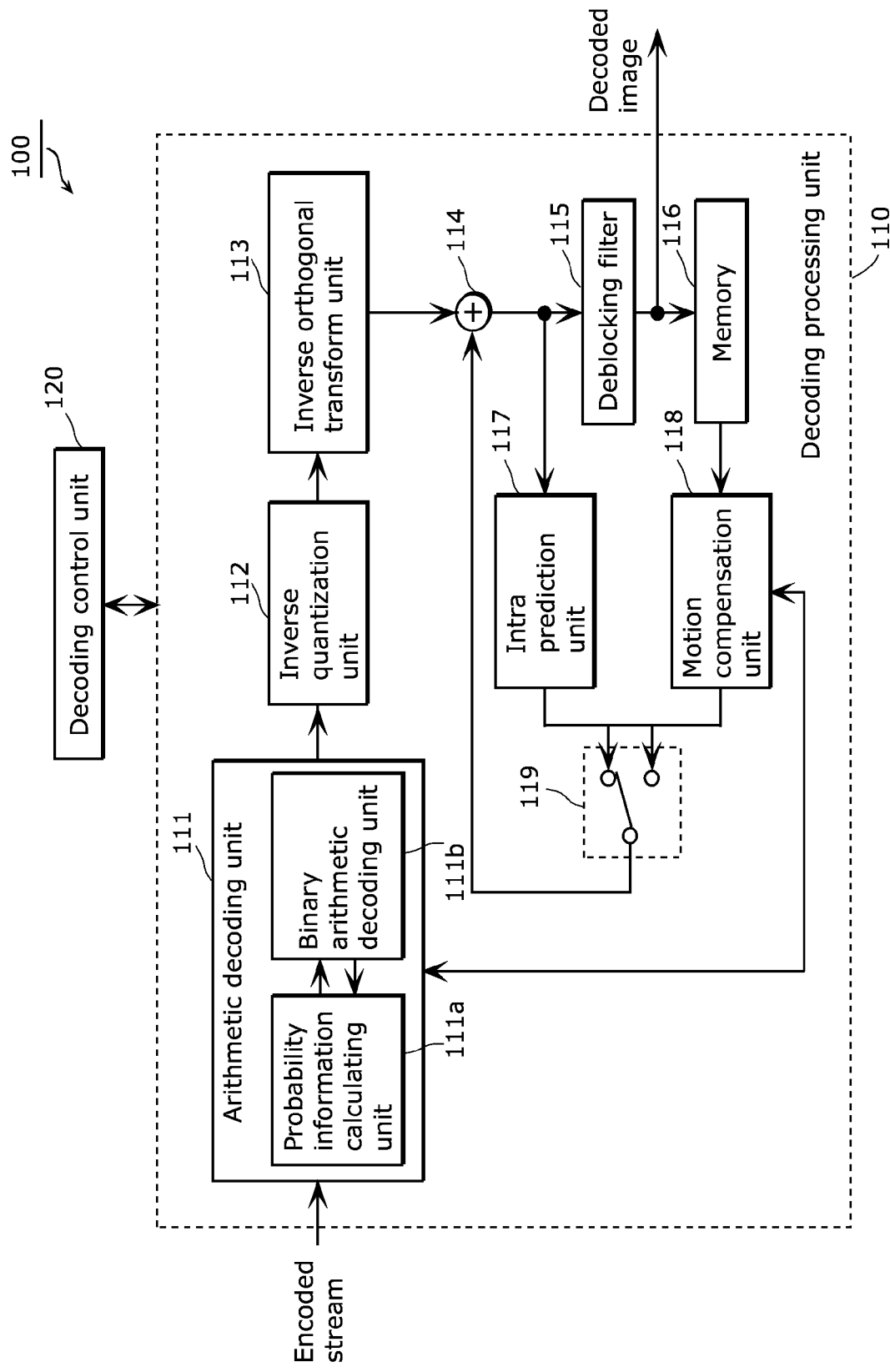
FIG. 1 is a block diagram illustrating a configuration of an image decoding apparatus according to Embodiment 1.

FIG. 1 is a block diagram illustrating a configuration of an image decoding apparatus according to the present embodiment. An image decoding apparatus 100 shown in FIG. 1 includes a decoding processing unit 110 and a decoding control unit 120. The decoding processing unit 110 sequentially decodes encoded block data contained in an encoded stream, thereby generating a decoded image constituted by a plurality of decoded blocks.

As shown in FIG. 1, the decoding processing unit 110 includes an arithmetic decoding unit 111, an inverse quantization unit 112, an inverse orthogonal transform unit 113, an adder 114, a deblocking filter 115, a memory 116, an intra prediction unit 117, a motion compensation unit 118 and a switch 119.

The arithmetic decoding unit 111 obtains an encoded stream and subjects it to arithmetic decoding (variable length decoding), and includes a probability information calculating unit 111a and a binary arithmetic decoding unit 111b.

The probability information calculating unit 111a outputs probability information, which indicates whether binary data outputted from the arithmetic decoding unit 111 takes a first value (for example, "0") or a second value (for example, "1"), to the binary arithmetic decoding unit 111b. The probability information calculating unit 111a holds, for example, probability information that is determined according to immediately preceding binary data generated by the binary arithmetic decoding unit 111b and a context, etc. as probability information. Then, the probability information calculating unit 111a outputs the probability information corresponding to the immediately preceding binary data and the context to the binary arithmetic decoding unit 111b.

The binary arithmetic decoding unit 111b decodes positional information contained in the encoded stream based on the probability information obtained from the probability information calculating unit 111a so as to generate binary data. Specific processing of the binary arithmetic decoding unit 111b will be described later.

The inverse quantization unit 112 inversely-quantizes a quantized coefficient block that has been generated by the arithmetic decoding by the arithmetic decoding unit 111. The inverse orthogonal transform unit 113 subjects each frequency coefficient contained in the inversely quantized coefficient block to an inverse orthogonal transform such as an inverse discrete cosine transform, thereby generating a decoding residue image.

The adder 114 obtains a prediction image from the switch 119 and adds this prediction image to the decoding residue image generated by the inverse orthogonal transform unit 113, thereby generating a decoded image (a decoded block).

The deblocking filter 115 removes a block distortion in the decoded image generated by the adder 114, and both stores this decoded image in the memory 116 and outputs this decoded image.

The intra prediction unit 117 uses the decoded image generated by the adder 114 to subject a current block to be decoded to an intra prediction, thereby generating a prediction image.

The motion compensation unit 118 subjects the current block to a motion compensation using a reference image stored in the memory 116 and a motion vector. By such a motion compensation, the motion compensation unit 118 generates a prediction image for the current block. How to obtain the motion vector will be detailed later.

If the current block has been intra-prediction-encoded, the switch 119 outputs the prediction image generated by the intra prediction unit 117 to the adder 114. On the other hand, if the current block has been inter-prediction-encoded, the switch 119 outputs the prediction image generated by the motion compensation unit 118 to the adder 114.

The decoding control unit 120 controls the decoding processing unit 110. For example, the decoding control unit 120 determines a data structure of encoded block data and obtains the motion vector by a method according to the determined data structure.

Figure 2:
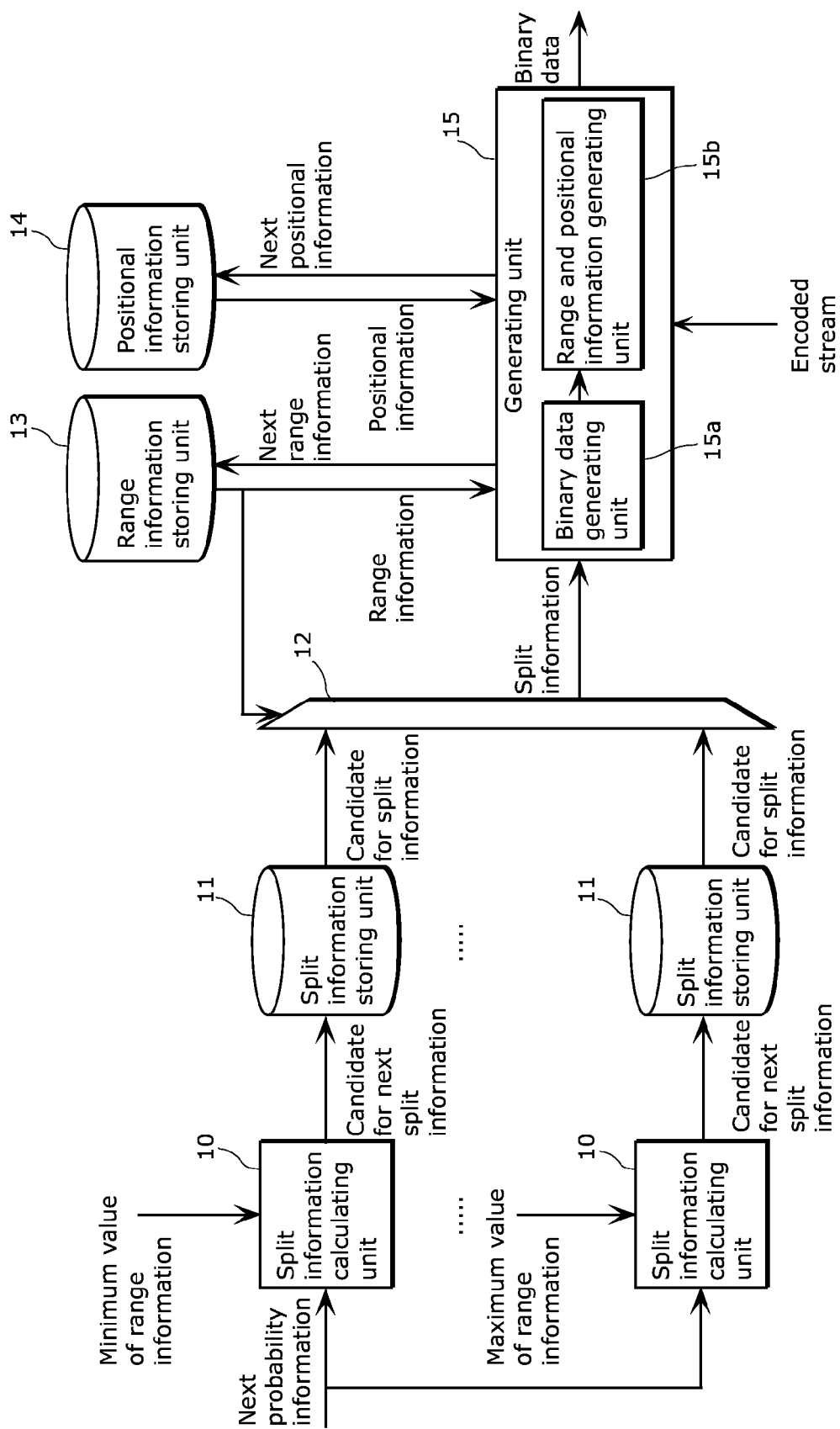
FIG. 2 is a block diagram illustrating a configuration of a binary arithmetic decoding unit according to Embodiment 1.

FIG. 2 is a block diagram illustrating a configuration of the binary arithmetic decoding unit 111b according to Embodiment 1 of the present disclosure. The binary arithmetic decoding unit 111b shown in FIG. 2 includes a split information calculating unit 10, a split information storing unit 11, a split information selecting unit 12, a range information storing unit 13, a positional information storing unit 14 and a generating unit 15. Further, the generating unit 15 includes a binary data generating unit 15a and a range and positional information generating unit 15b.

The split information calculating unit 10 calculates candidates for the split information based on the probability information and the range information and causes the split information storing unit 11 to store them. The probability information used in the split information calculating unit 10 corresponds to the next binary data and is obtained from the probability information calculating unit 111a. The range information used in the split information calculating unit 10 corresponds to a range of the range information that could be generated by the range and positional information generating unit 15b.

The "range information" indicates a possible range of the positional information obtained from the encoded stream and has an initial value of 0.0 to 1.0. Also, the range information is updated in the range and positional information generating unit 15b every time binary data is generated by the generating unit 15. The "split information" indicates a border between the range of a first value and that of a second value in the range information.

In other words, the split information cannot be calculated in nature until new range information is generated by the range and positional information generating unit 15b. Accordingly, the split information calculating unit 10 calculates, as a candidate for the split information, split information corresponding to each piece of range information that could be generated next.

More specifically, the binary arithmetic decoding unit 111b includes a plurality of the split information calculating units 10. Then, next range information that could be calculated ("0.0 to 0.5," "0.0 to 0.6," "0.0 to 0.7," "0.0 to 0.8," "0.0 to 0.9," etc.) is set to each of the split information calculating units 10. Each of the split information calculating units 10 calculates candidates for the split information based on the probability information obtained from the probability information calculating unit 111a and the set range information.

For example, when the probability information obtained from the probability information calculating unit 111a is 5:3 (probability of first value:probability of second value) and the set range information is 0.0 to 0.8, the split information calculating unit 10 calculates 0.5 (=0.8×5/8) as a candidate for the split information and causes the split information storing unit 11 to store it.

The split information storing unit 11 stores the candidates for the split information calculated by the split information calculating unit 10. Specific configurations of the storing unit are not particularly limited and may be any means, for example, DRAM (dynamic random access memory), SDRAM (synchronous dynamic random access memory), a flash memory, a ferroelectric memory or HDD (hard disk drive) as long as such means can store data. The same applies also to the other storing units described below.

Based on the range information calculated by the range and positional information generating unit 15b, the split information selecting unit 12 selects any of the candidates for the split information stored in the split information storing unit 11 as the split information and notifies the generating unit 15 of the split information. The range information used in the split information selecting unit 12 is the range information stored in the range information storing unit 13.

Based on the split information of which the split information selecting unit 12 has notified the generating unit 15, the range information stored in the range information storing unit 13 and the positional information stored in the positional information storing unit 14, the generating unit 15 generates binary data and the range information and the positional information corresponding to the next binary data.

More specifically, the binary data generating unit 15a generates the binary data according to which of the ranges of the range information divided at the split information includes the positional information. For example, when the range information is 0.0 to 0.8, the split information is 0.5 and the positional information is 0.75, the binary data generating unit 15a generates and outputs a second value (1) as the binary data.

Also, the range and positional information generating unit 15b generates the next range information and the next positional information based on the binary data generated by the binary data generating unit 15a and causes the range information storing unit 13 and the positional information storing unit 14 to store them. In the example above, the renormalization results in the range information of 0.0 to 0.6 and the positional information of 0.5. Then, the range and positional information generating unit 15b causes the range information storing unit 13 to store the generated range information and the positional information storing unit 14 to store the generated positional information.

Figure 3A:
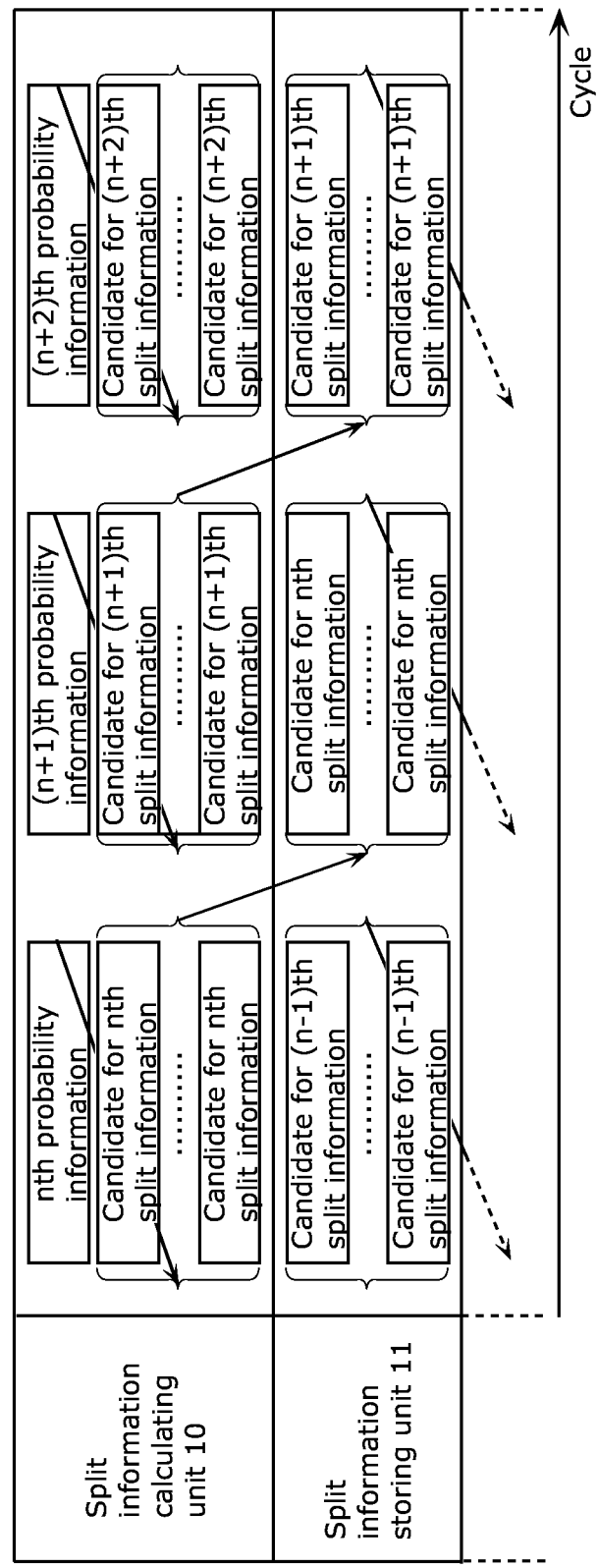
FIG. 3A is a conceptual diagram for describing an operation of the configuration shown in FIG. 2.
Figure 3B:
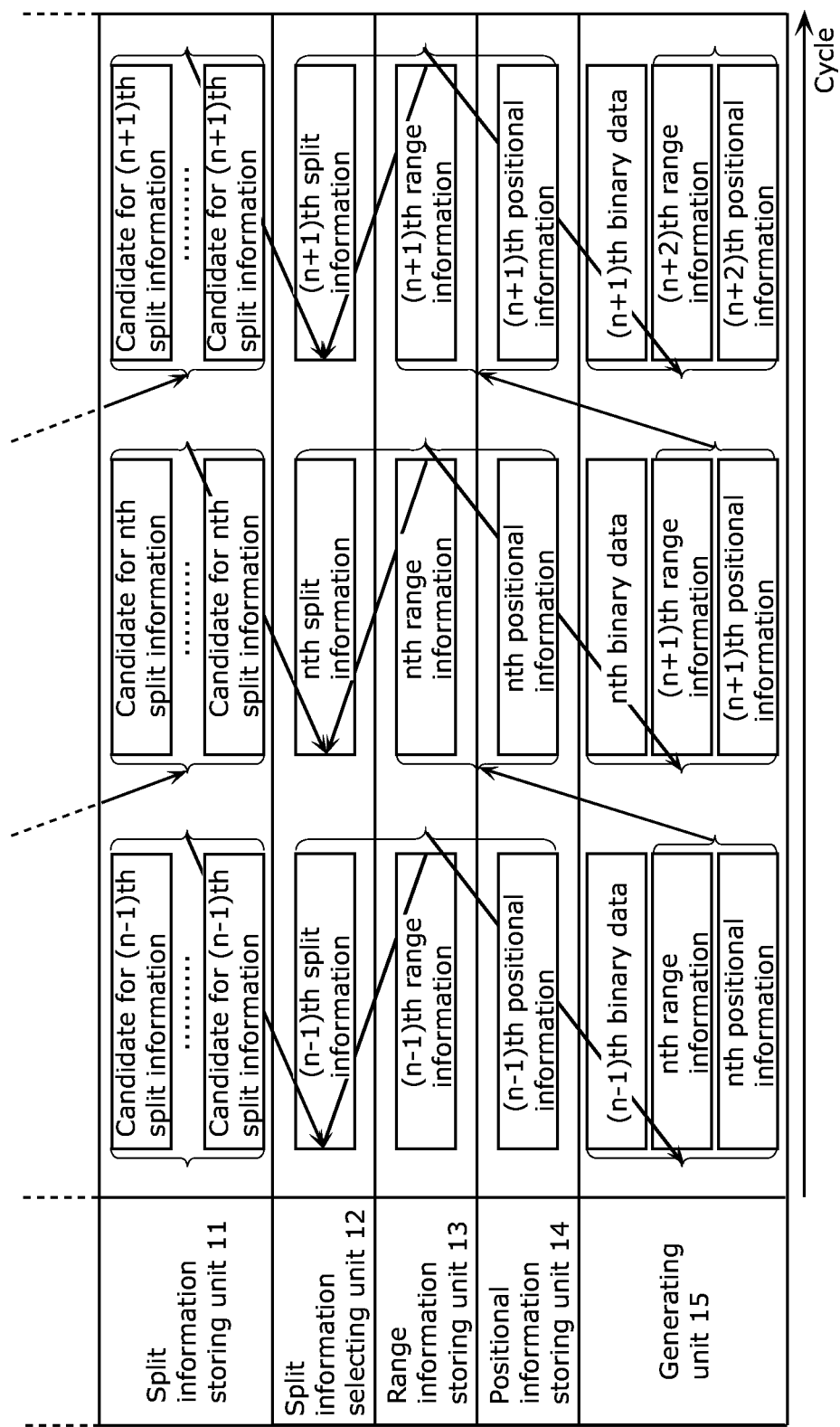
FIG. 3B is a conceptual diagram for describing the operation of the configuration shown in FIG. 2.
Figure 3C:
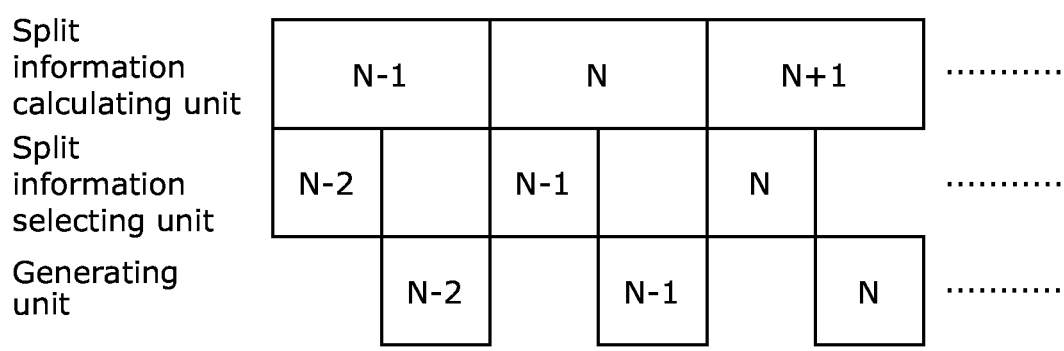
FIG. 3C is a timing chart showing operation timing of individual structural components in FIG. 2.

Referring to FIGS. 3A, 3B and 3C, the operation of the binary arithmetic decoding unit 111b according to Embodiment 1 will be described. FIGS. 3A and 3B are conceptual diagrams for describing the operation of the configuration shown in FIG. 2. It should be noted that the conceptual diagram for describing the operation of the configuration of FIG. 2 is divided into two figures, i.e., FIG. 3A and FIG. 3B, where the split information storing unit 11 is redundant. FIG. 3C is a timing chart showing operation timing of individual functional blocks in FIG. 2.

According to FIGS. 3A and 3B, in a cycle where the generating unit 15 calculates the (n−1)th binary data, range information corresponding to the nth binary data has not been determined. Thus, based on a range of the range information that could be generated by the range and positional information generating unit 15b, the split information calculating unit 10 calculates a plurality of candidates for the split information corresponding to the nth binary data and causes the split information storing unit 11 to store them.

Next, in a cycle where the generating unit 15 calculates the nth binary data, the range information corresponding to the nth binary data and the plurality of candidates for the split information corresponding to the nth binary data have been determined. Accordingly, based on the range information that is stored in the range information storing unit 13 and corresponds to the nth binary data, the split information selecting unit 12 selects as the split information any of the plurality of candidates for the split information that are stored in the split information storing unit 11 and correspond to the nth binary data and notifies the generating unit 15 of that split information. Then, based on the split information corresponding to the nth binary data of which the split information selecting unit 12 has notified the generating unit 15, the range information and the positional information that are stored in the range information storing unit 13 and the positional information storing unit 14 and correspond to the nth binary data, the generating unit 15 generates the nth binary data and range information and positional information corresponding to the (n+1)th binary data.

In other words, as shown in FIG. 3C, in parallel with the split information calculating unit 10 calculating the candidates for the split information corresponding to the nth binary data, the split information selecting unit 12 selects the (n−1)th split information and the generating unit 15 generates the (n−1)th binary data. In this manner, the process of the split information selecting unit 12 and that of the generating unit 15 are executed in series, and the process of the split information calculating unit 10 and those of the split information selecting unit 12 and the generating unit 15 are executed in parallel (pipelined).

In this way, in the arithmetic encoding system where an appearance probability of next binary data is determined independently of binary data, the binary arithmetic decoding unit 111b according to Embodiment 1 of the present disclosure can pipeline the split information calculating process and the binary data calculating process while decoding one item of the binary data per cycle, thus speeding up the binary arithmetic decoding process. The pipelining time is given by max(required processing time for split information calculating unit 10, required processing time for split information selecting unit 12+required processing time for generating unit 15).

Embodiment 2

Figure 4:
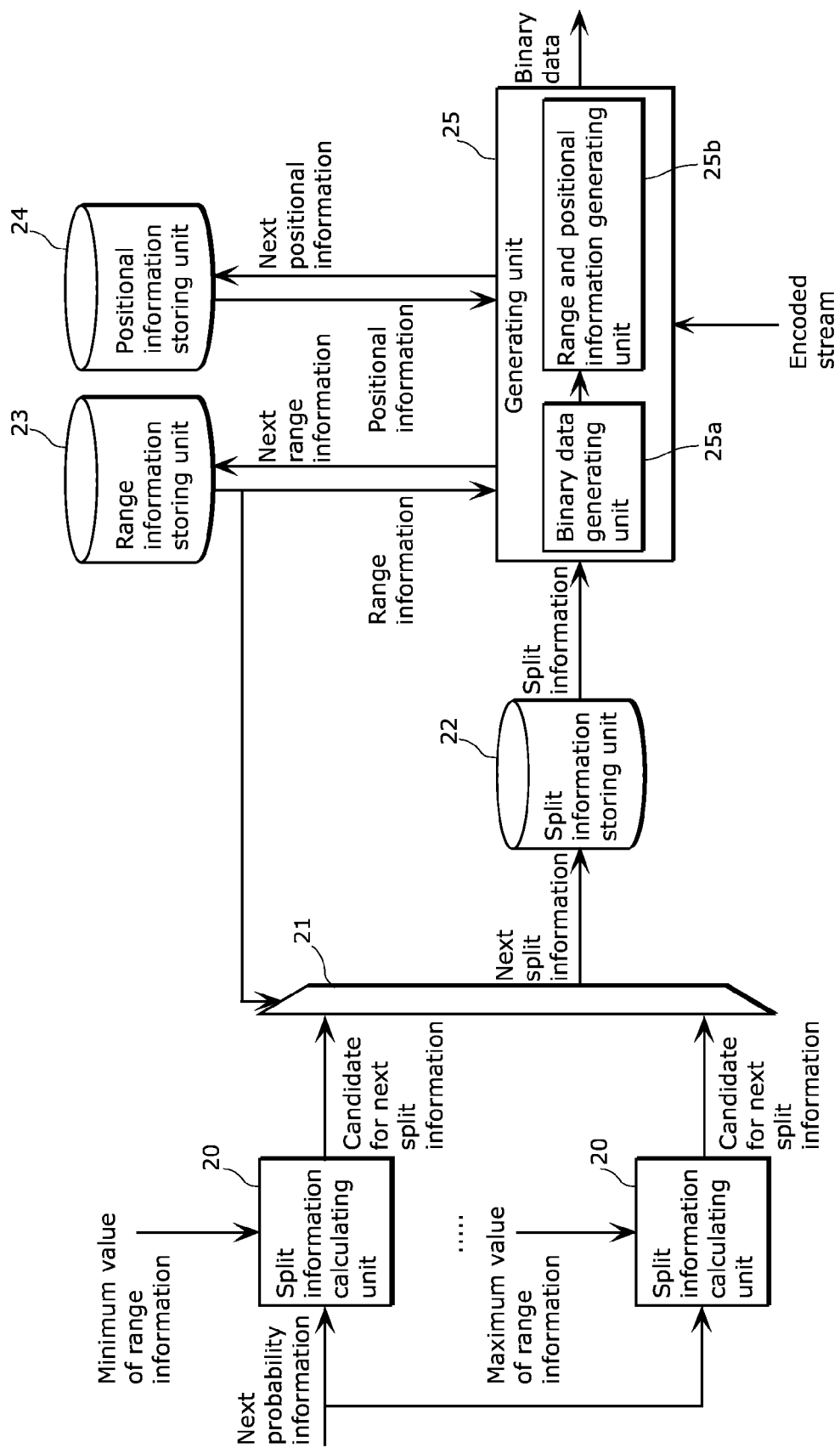
FIG. 4 is a block diagram illustrating a configuration of a binary arithmetic decoding unit according to Embodiment 2.

FIG. 4 is a block diagram illustrating a configuration of a binary arithmetic decoding unit 111b according to Embodiment 2 of the present disclosure. The binary arithmetic decoding unit 111b shown in FIG. 4 includes a split information calculating unit 20, a split information selecting unit 21, a split information storing unit 22, a range information storing unit 23, a positional information storing unit 24 and a generating unit 25. The generating unit 25 includes a binary data generating unit 25a and a range and positional information generating unit 25b. Incidentally, individual structural components shown in FIG. 4 have common basic operations with the structural components in FIG. 2 having the same names. Thus, the description will be directed not to the common points but mainly to differences.

Since the split information calculating unit 20 is similar to the split information calculating unit 10 in FIG. 2, the description thereof will be omitted. However, the split information calculating unit 20 according to Embodiment 2 does not cause the split information storing unit 22 to store the calculated candidates for the split information but notifies the split information selecting unit 21 of these candidates.

Based on the range information generated by the range and positional information generating unit 25b, the split information selecting unit 21 selects, as the split information, any of the candidates for the split information of which the split information calculating unit 20 has notified the split information selecting unit 21 and causes the split information storing unit 22 to store it. The range information used in the split information selecting unit 21 is the next range information of which the range and positional information generating unit 25b notifies the split information selecting unit 21.

The split information storing unit 22 stores the split information selected by the split information selecting unit 21. Here, in contrast to Embodiment 1 where the split information storing unit 11 stores the candidates for the split information calculated by the split information calculating unit 10, the split information storing unit 22 according to Embodiment 2 stores the split information selected by the split information selecting unit 21.

Based on the split information stored in the split information storing unit 22, the range information stored in the range information storing unit 23 and the positional information stored in the positional information storing unit 24, the generating unit 25 generates binary data and the range information and the positional information corresponding to the next binary data. Then, the generating unit 25 outputs the generated binary data, causes the range information storing unit 23 to store the generated range information while notifying the split information selecting unit 21 of that range information, and causes the positional information storing unit 24 to store the generated positional information.

Figure 5A:
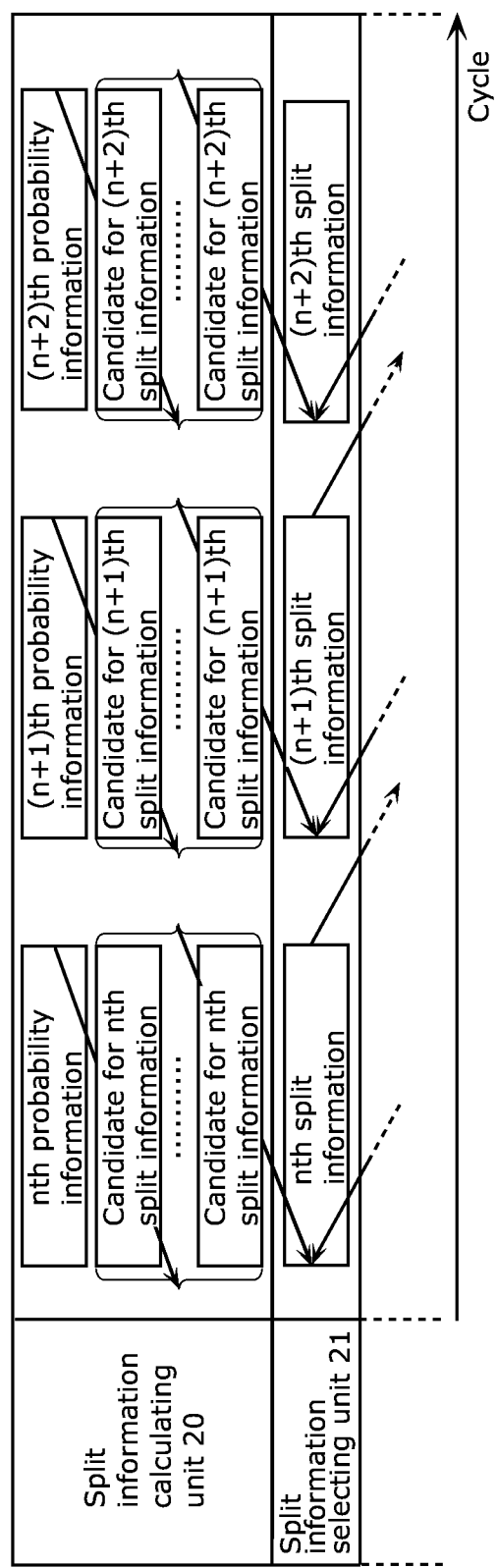
FIG. 5A is a conceptual diagram for describing an operation of the configuration shown in FIG. 4.
Figure 5B:
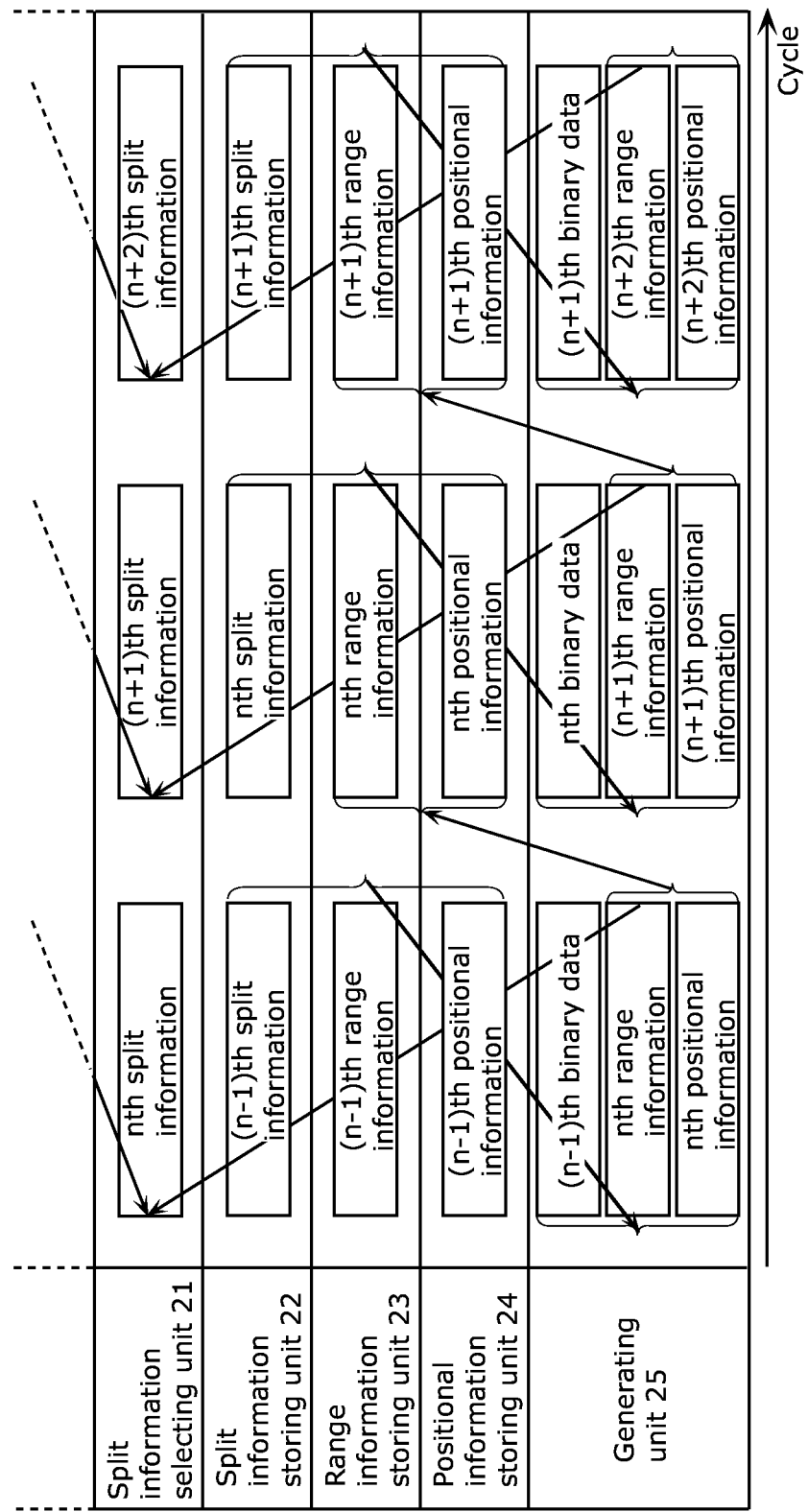
FIG. 5B is a conceptual diagram for describing the operation of the configuration shown in FIG. 4.
Figure 5C:
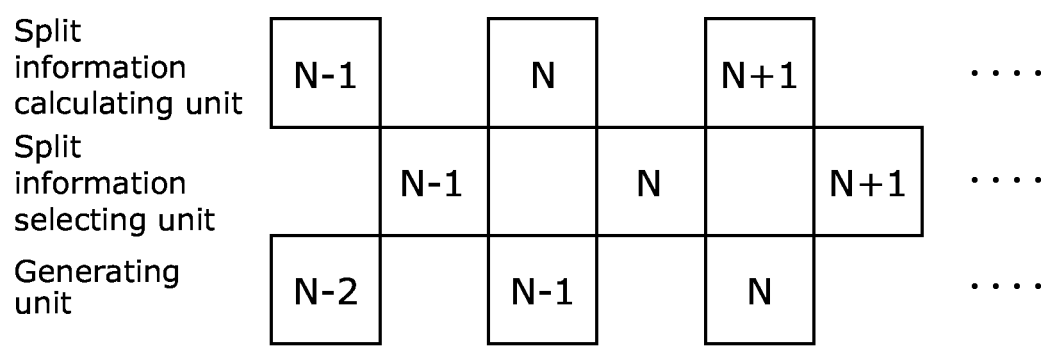
FIG. 5C is a timing chart showing operation timing of individual structural components in FIG. 4.

Now, referring to FIGS. 5A, 5B and 5C, the operation of the binary arithmetic decoding unit 111b according to Embodiment 2 will be described. FIGS. 5A and 5B are conceptual diagrams for describing the operation of the configuration shown in FIG. 4. It should be noted that the conceptual diagram for describing the operation of the configuration of FIG. 4 is divided into two figures, i.e., FIG. 5A and FIG. 5B, where the split information selecting unit 21 is redundant. FIG. 5C is a timing chart showing operation timing of individual functional blocks in FIG. 4.

According to FIGS. 5A and 5B, in a cycle where the generating unit 25 calculates the (n−1)th binary data, range information corresponding to the nth binary data has not been determined. Thus, based on a range of the range information that could be generated by the range and positional information generating unit 25b, the split information calculating unit 20 calculates a plurality of candidates for the split information corresponding to the nth binary data and notifies the split information selecting unit 21 of them.

At this time, as shown in FIG. 5C, the generating unit 25 and the split information calculating unit 20 operate in parallel. Then, once the range information corresponding to the nth binary data and the plurality of the candidates for the split information corresponding to the nth binary data are determined, the split information selecting unit 21 selects as the split information any of the plurality of the candidates for the split information corresponding to the nth binary data of which the split information calculating unit 20 has notified the split information selecting unit 21 based on the range information corresponding to the nth binary data of which the range and positional information generating unit 25b has notified the split information selecting unit 21, and causes the split information storing unit 22 to store that candidate.

Next, in a cycle where the generating unit 25 calculates the nth binary data, the split information corresponding to the nth binary data has been determined. Then, based on the split information that is stored in the split information storing unit 22 and corresponds to the nth binary data, and the range information and the positional information that are stored in the range information storing unit 23 and the positional information storing unit 24 and correspond to the nth binary data, the generating unit 25 generates the nth binary data and range information and positional information corresponding to the (n+1)th binary data.

As described above, since the binary arithmetic decoding unit 111b according to Embodiment 2 of the present disclosure needs to include only one split information storing unit 22, it is possible to reduce necessary resources compared with Embodiment 1 necessitating as many split information storing units 11 as the candidates for the split information. The pipelining time is given by max(required processing time for split information calculating unit 20, required processing time for generating unit 25)+required processing time for split information selecting unit 21.

Embodiment 3

Figure 6:
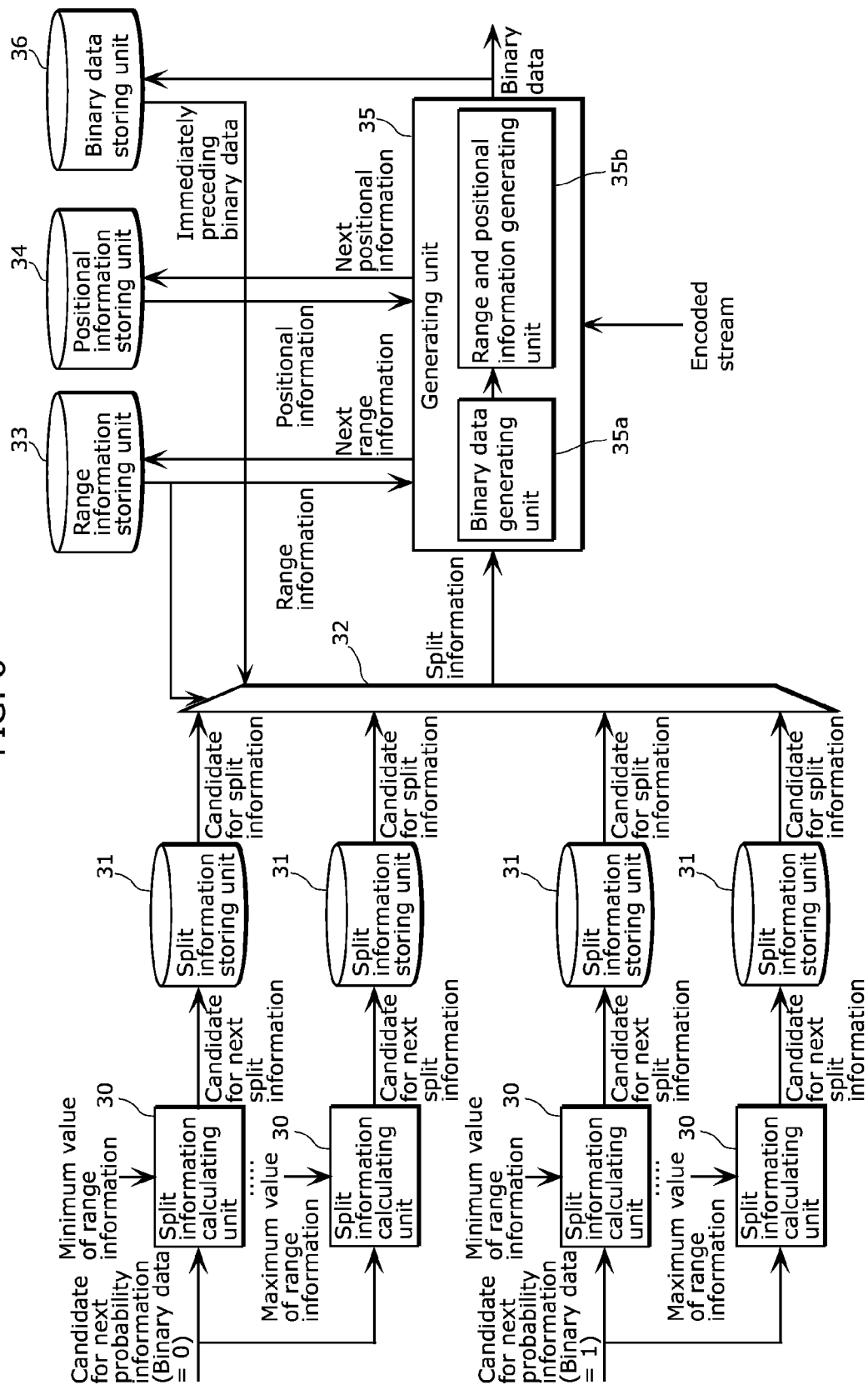
FIG. 6 is a block diagram illustrating a configuration of a binary arithmetic decoding unit according to Embodiment 3.

FIG. 6 is a block diagram illustrating a configuration of a binary arithmetic decoding unit 111b according to Embodiment 3 of the present disclosure. The binary arithmetic decoding unit 111b shown in FIG. 6 includes a split information calculating unit 30, a split information storing unit 31, a split information selecting unit 32, a range information storing unit 33, a positional information storing unit 34, a generating unit 35 and a binary data storing unit 36. The generating unit 35 includes a binary data generating unit 35a and a range and positional information generating unit 35b.

Incidentally, individual structural components shown in FIG. 6 have common basic operations with the structural components in FIG. 2 having the same names. Thus, the description will be directed not to the common points but mainly to differences.

The split information calculating unit 30 calculates candidates for the split information based on the probability information and the range information and causes the split information storing unit 31 to store them. Pieces of the probability information used in the split information calculating unit 30 are probability information corresponding to next binary data when immediately preceding binary data takes 0 and probability information corresponding to next binary data when immediately preceding binary data takes 1. The range information used in the split information calculating unit 30 corresponds to a range of the range information that could be generated by the range and positional information generating unit 35b.

The split information storing unit 31 stores the candidates for the split information calculated by the split information calculating unit 30. In other words, it is necessary to provide as many split information storing units 31 according to Embodiment 3 as the calculated candidates for the split information, similarly to Embodiment 1.

Based on the range information and binary data generated by the generating unit 35, the split information selecting unit 32 selects any of the candidates for the split information stored in the split information storing unit 31 as the split information and notifies the generating unit 35 of that candidate. The range information used in the split information selecting unit 32 is the range information stored in the range information storing unit 33. The binary data used in the split information selecting unit 32 is the immediately preceding binary data stored in the binary data storing unit 36.

Based on the split information of which the split information selecting unit 32 has notified the generating unit 35, the range information stored in the range information storing unit 33 and the positional information stored in the positional information storing unit 34, the generating unit 35 generates binary data and the range information and the positional information corresponding to the next binary data. Then, the generating unit 35 outputs the generated binary data while causing the binary data storing unit 36 to store the generated binary data, causes the range information storing unit 33 to store the generated range information, and causes the positional information storing unit 34 to store the generated positional information.

Figure 7A:
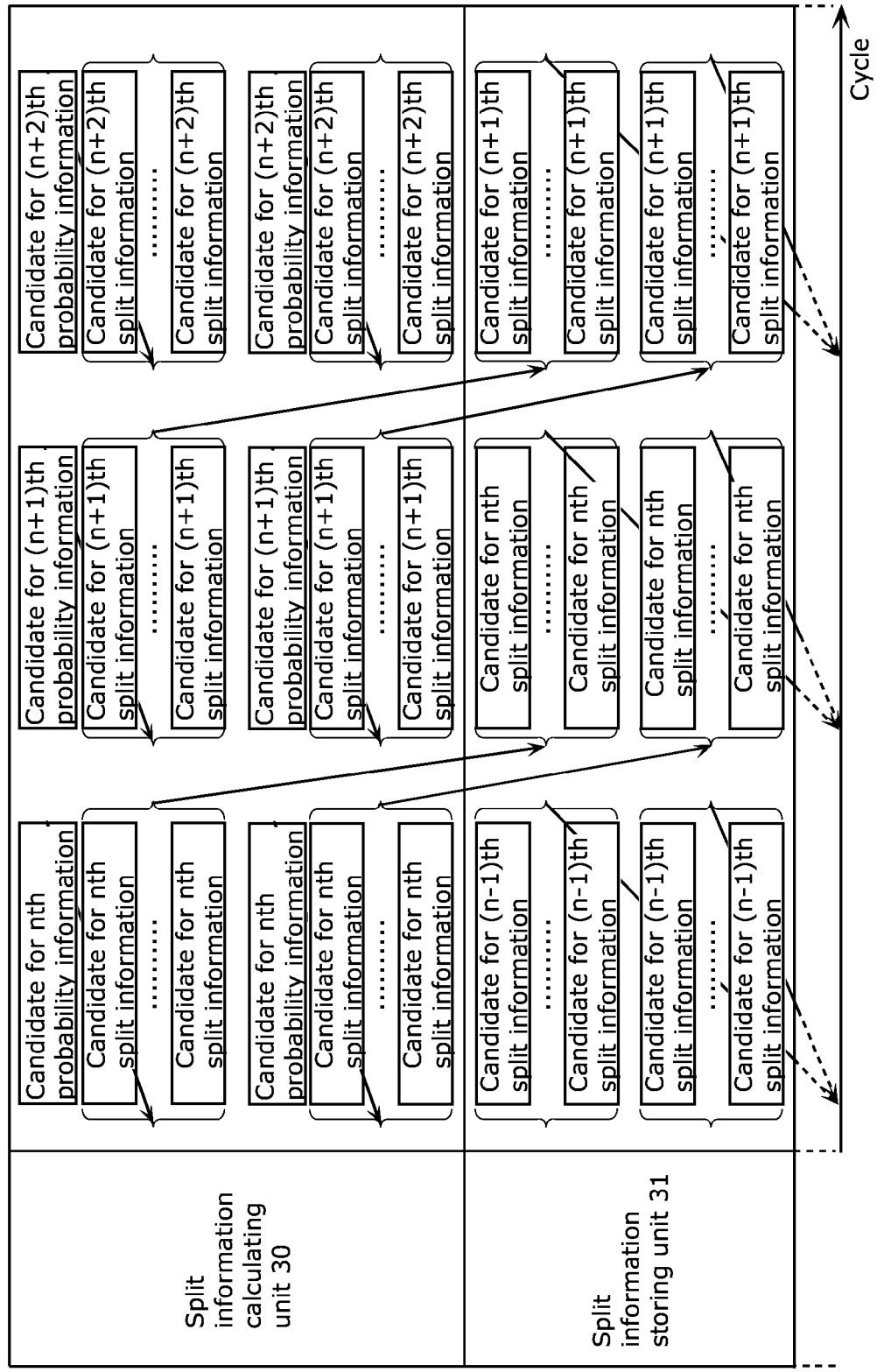
FIG. 7A is a conceptual diagram for describing an operation of the configuration shown in FIG. 6.
Figure 7B:
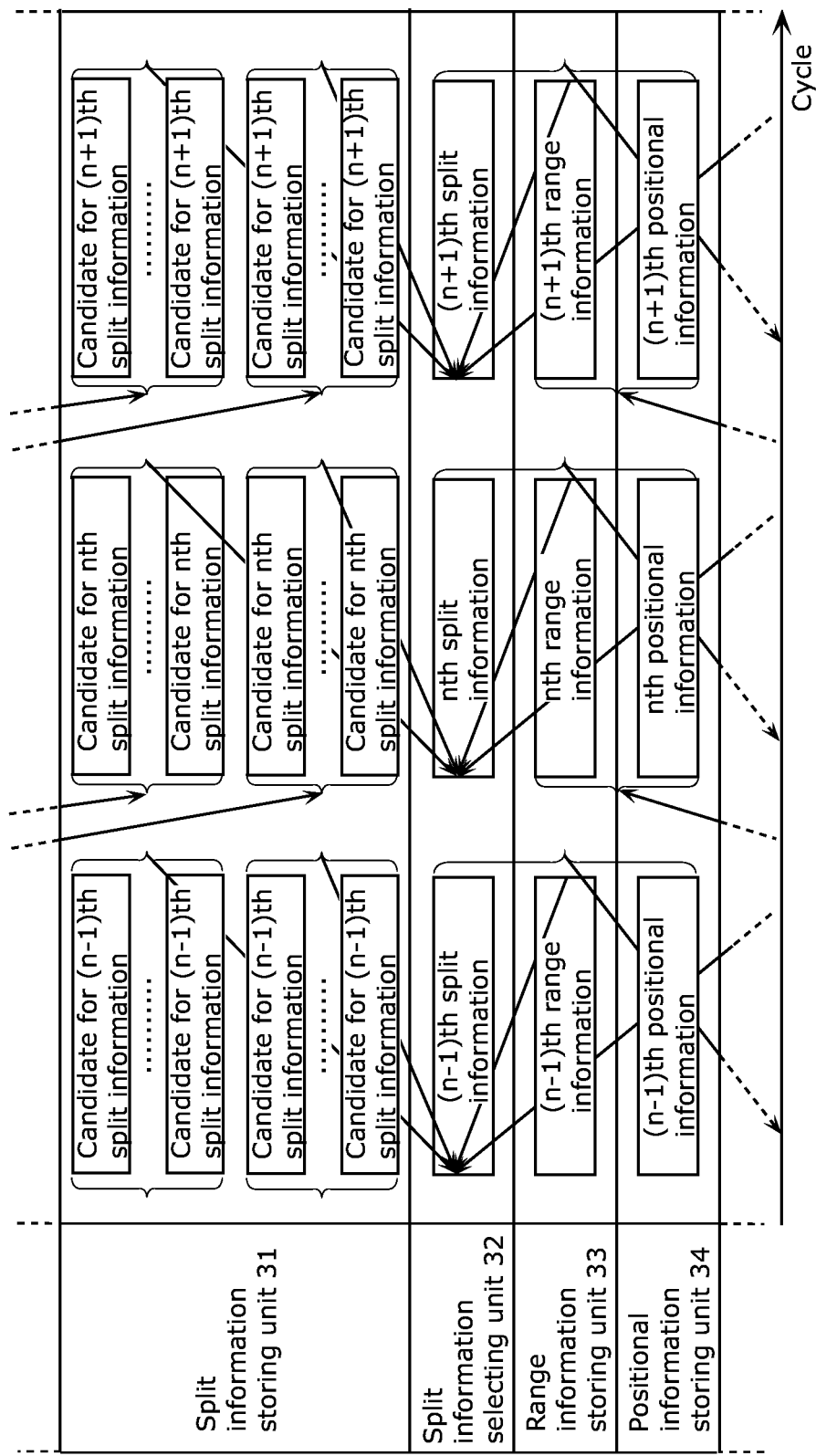
FIG. 7B is a conceptual diagram for describing the operation of the configuration shown in FIG. 6.
Figure 7C:
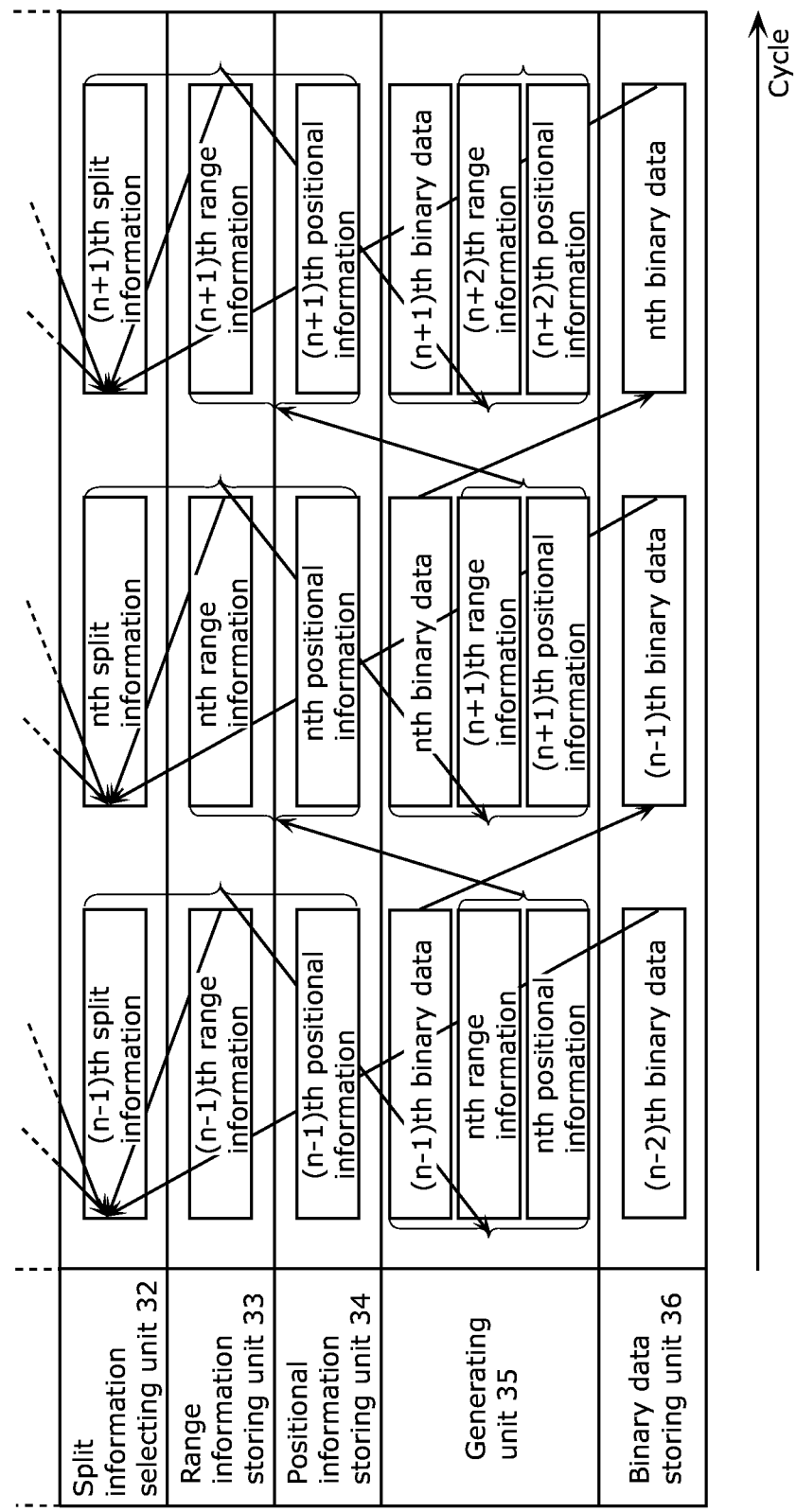
FIG. 7C is a conceptual diagram for describing the operation of the configuration shown in FIG. 6.

Now, referring to FIGS. 7A, 7B and 7C, the operation of the binary arithmetic decoding unit 111b according to Embodiment 3 will be described. FIGS. 7A, 7B and 7C are conceptual diagrams for describing the operation of the configuration shown in FIG. 6. It should be noted that the conceptual diagram for describing the operation of the configuration of FIG. 6 is divided into three figures, i.e., FIGS. 7A, 7B and 7C, where the split information storing unit 31, the split information selecting unit 32, the range information storing unit 33 and the positional information storing unit 34 are redundant. Additionally, the timing chart shown in FIG. 3C also applies to Embodiment 3.

In accordance with FIGS. 7A, 7B and 7C, in a cycle where the generating unit 35 calculates the (n−1)th binary data, range information corresponding to the nth binary data and the probability information corresponding to the nth binary data have not been determined. Thus, based on a range of the range information that could be generated by the range and positional information generating unit 35b, probability information corresponding to the nth binary data when the (n−1)th binary data takes 0 and probability information corresponding to the nth binary data when the (n−1)th binary data takes 1, the split information calculating unit 30 calculates a plurality of candidates for the split information corresponding to the nth binary data and causes the split information storing unit 31 to store them.

In a cycle where the generating unit 35 calculates the nth binary data, the range information corresponding to the nth binary data, the (n−1)th binary data and the plurality of candidates for the split information corresponding to the nth binary data have been determined. Accordingly, based on the range information that is stored in the range information storing unit 33 and corresponds to the nth binary data and the (n−1)th binary data that is stored in the binary data storing unit 36, the split information selecting unit 32 selects as the split information any of the plurality of candidates for the split information that are stored in the split information storing unit 31 and correspond to the nth binary data and notifies the generating unit 35 of that split information. Then, based on the split information that corresponds to the nth binary data of which the split information selecting unit 32 has notified the generating unit 35, and the range information and the positional information that are stored in the range information storing unit 33 and the positional information storing unit 34 and correspond to the nth binary data, the generating unit 35 generates the nth binary data and range information and positional information corresponding to the (n+1)th binary data.

In this way, in the arithmetic encoding system where an appearance probability of next binary data is determined depending on binary data, the binary arithmetic decoding unit 111b according to Embodiment 3 of the present disclosure can pipeline the split information calculating process and the binary data calculating process while decoding one item of the binary data per cycle, thus speeding up the binary arithmetic decoding process. The pipelining time is given by max(required processing time for split information calculating unit 30, required processing time for split information selecting unit 32+required processing time for generating unit 35).

Embodiment 4

Figure 8:
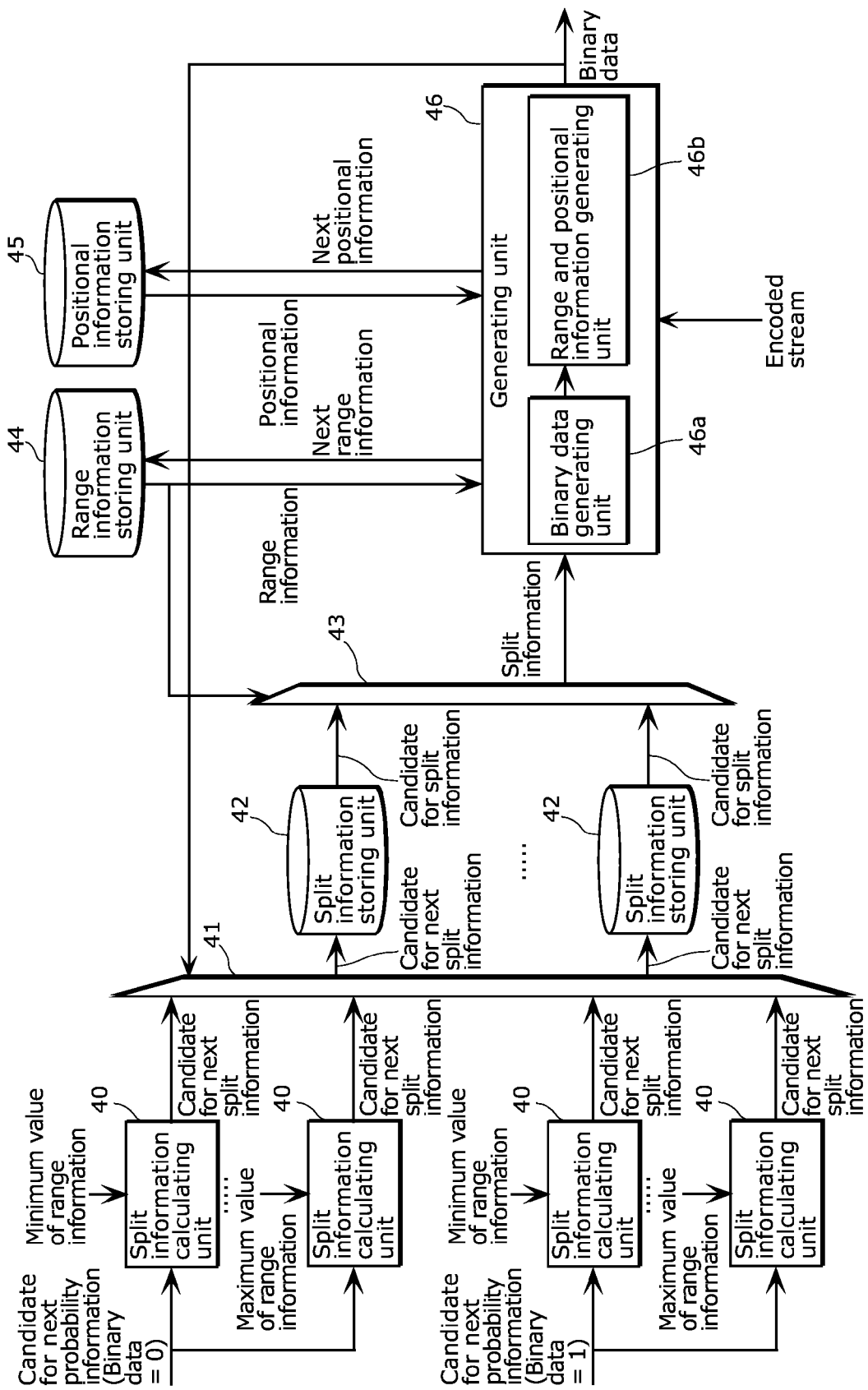
FIG. 8 is a block diagram illustrating a configuration of a binary arithmetic decoding unit according to Embodiment 4.

FIG. 8 is a block diagram illustrating a configuration of a binary arithmetic decoding unit 111b according to Embodiment 4 of the present disclosure. The binary arithmetic decoding unit 111b shown in FIG. 8 includes a split information calculating unit 40, a first split information selecting unit 41, a split information storing unit 42, a second split information selecting unit 43, a range information storing unit 44, a positional information storing unit 45 and a generating unit 46. The generating unit 46 includes a binary data generating unit 46a and a range and positional information generating unit 46b. Incidentally, individual structural components shown in FIG. 8 have common basic operations with the structural components in FIG. 2 having the same names. Thus, the description will be directed not to the common points but mainly to differences.

Since the split information calculating unit 40 is similar to the split information calculating unit 30 in FIG. 6, the description thereof will be omitted. However, the split information calculating unit 40 according to Embodiment 4 does not cause the split information storing unit 42 to store the calculated candidates for the split information but notifies the first split information selecting unit 41 of these candidates.

Based on the immediately preceding binary data, the first split information selecting unit 41 selects part of the candidates for the split information of which the split information calculating unit 40 has notified the first split information selecting unit 41 and causes the split information storing unit 42 to store that part. The binary data used in the first split information selecting unit 41 is the immediately preceding binary data of which the binary data generating unit 46a notifies the first split information selecting unit 41.

The split information storing unit 42 stores the candidates for the split information selected by the first split information selecting unit 41. In other words, the candidates for the split information stored in the split information storing unit 42 are candidates for the split information corresponding to the immediately preceding binary data calculated by the binary data generating unit 46a among the candidates for the split information when the immediately preceding binary data takes a first value (0) and the candidates for the split information when the immediately preceding binary data takes a second value (1).

Based on the range information calculated by the range and positional information generating unit 46b, the second split information selecting unit 43 selects any of the candidates for the split information stored in the split information storing unit 42 as the split information and notifies the generating unit 46 of that candidate. The range information used in the second split information selecting unit 43 is the range information stored in the range information storing unit 44.

Based on the split information of which the second split information selecting unit 43 has notified the generating unit 46, the range information stored in the range information storing unit 44 and the positional information stored in the positional information storing unit 45, the generating unit 46 generates binary data and the range information and the positional information corresponding to the next binary data. Then, the generating unit 46 outputs the generated binary data while notifying the first split information selecting unit 41 of the generated binary data, causes the range information storing unit 44 to store the generated range information, and causes the positional information storing unit 45 to store the generated positional information.

Figure 9A:
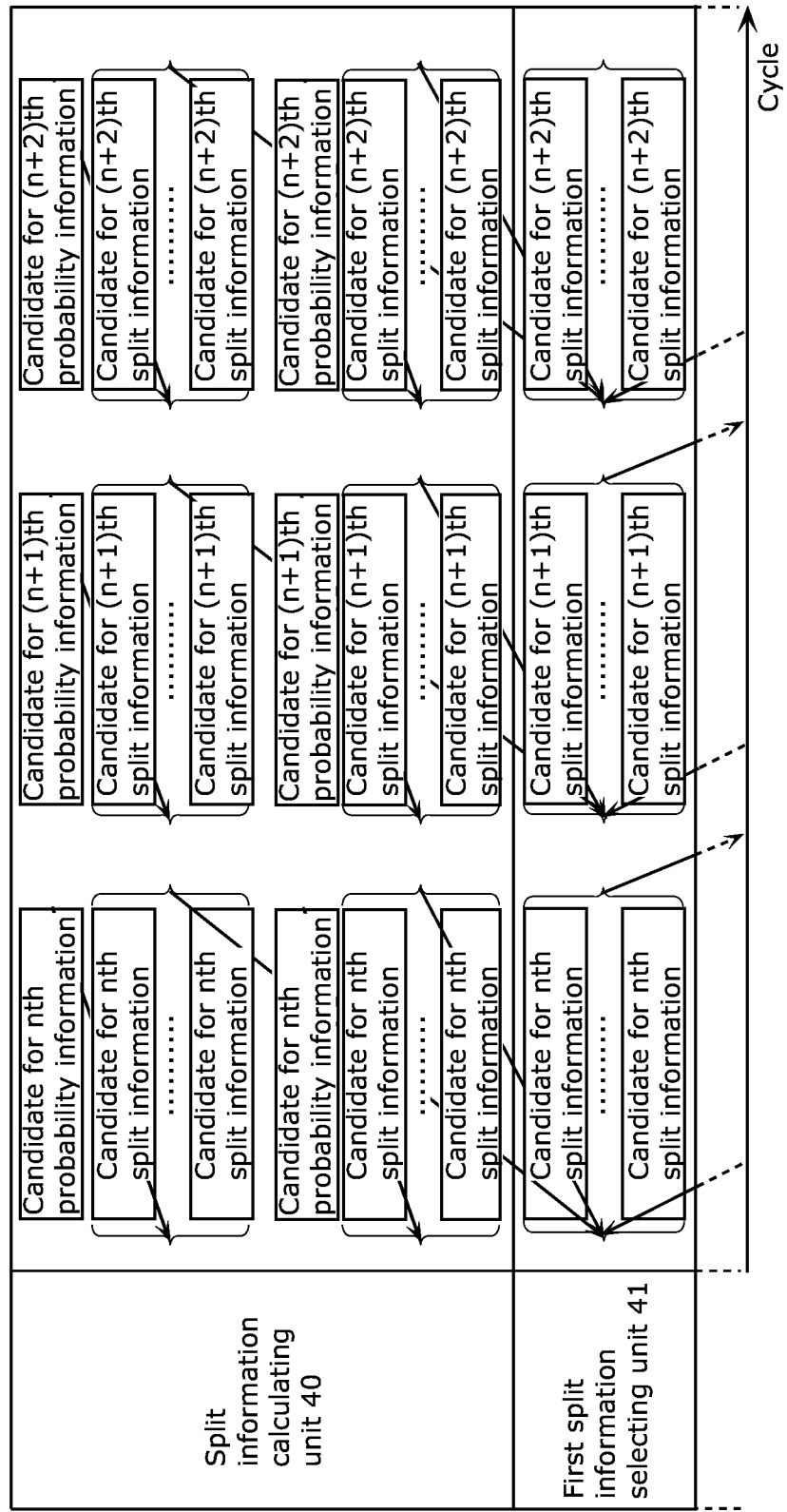
FIG. 9A is a conceptual diagram for describing an operation of the configuration shown in FIG. 8.
Figure 9B:
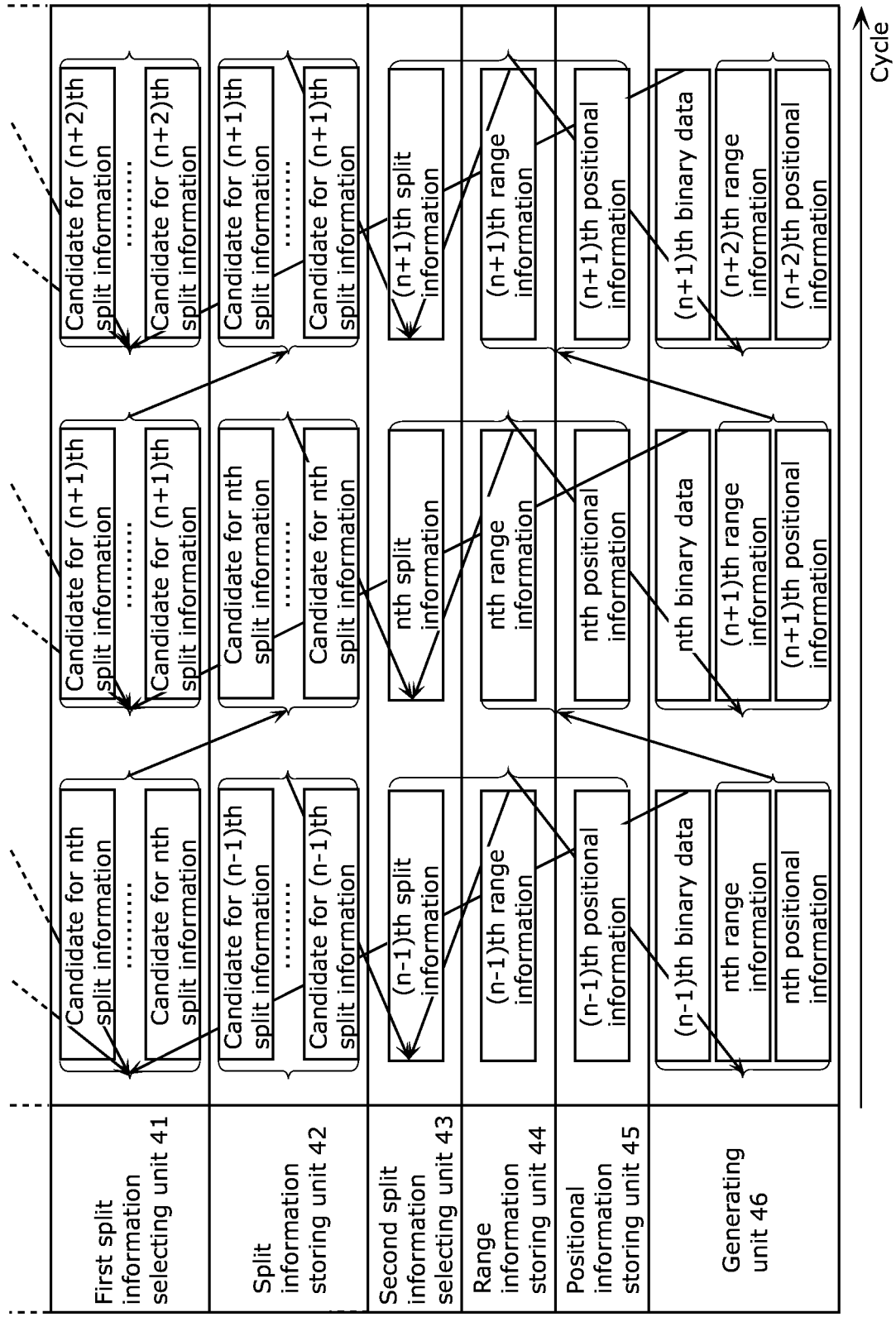
FIG. 9B is a conceptual diagram for describing the operation of the configuration shown in FIG. 8.

Now, referring to FIGS. 9A, 9B and 9C, the operation of the binary arithmetic decoding unit 111b according to Embodiment 4 will be described. FIGS. 9A and 9B are conceptual diagrams for describing the operation of the configuration shown in FIG. 8. It should be noted that the conceptual diagram for describing the operation of the configuration of FIG. 8 is divided into two figures, i.e., FIG. 9A and FIG. 9B, where the first split information selecting unit 41 is redundant. FIG. 9C is a timing chart showing operation timing of individual functional blocks in FIG. 8.

According to FIGS. 9A and 9B, in a cycle where the generating unit 46 calculates the (n−1)th binary data, range information corresponding to the nth binary data and probability information corresponding to the nth binary data have not been determined. Thus, based on a range of the range information that could be generated by the range and positional information generating unit 46b, probability information corresponding to the nth binary data when the (n−1)th binary data takes 0 and probability information corresponding to the nth binary data when the (n−1)th binary data takes 1, the split information calculating unit 40 calculates a plurality of candidates for the split information corresponding to the nth binary data and notifies the first split information selecting unit 41 of these candidates.

At this time, the generating unit 46 and the split information calculating unit 40 operate in parallel. Then, once the (n−1)th binary data and the plurality of the candidates for the split information corresponding to the nth binary data are determined, the first split information selecting unit 41 selects part of the plurality of the candidates for the split information corresponding to the nth binary data of which the split information calculating unit 40 has notified the first split information selecting unit 41 based on the (n−1)th binary data of which the binary data generating unit 46a has notified the first split information selecting unit 41, and causes the split information storing unit 42 to store that part.

Next, in a cycle where the generating unit 46 calculates the nth binary data, the range information corresponding to the nth binary data and the plurality of candidates for the split information corresponding to the nth binary data have been determined. Accordingly, based on the range information that is stored in the range information storing unit 44 and corresponds to the nth binary data, the second split information selecting unit 43 selects as the split information any of the plurality of candidates for the split information that are stored in the split information storing unit 42 and correspond to the nth binary data and notifies the generating unit 46 of that split information. Based on the split information that corresponds to the nth binary data of which the second split information selecting unit 43 has notified the generating unit 46, and the range information and the positional information that are stored in the range information storing unit 44 and the positional information storing unit 45 and correspond to the nth binary data, the generating unit 46 generates the nth binary data and range information and positional information corresponding to the (n+1)th binary data.

As described above, since the binary arithmetic decoding unit 111b according to Embodiment 4 of the present disclosure needs to include only as many split information storing units 42 as corresponding ranges of the range information, it is possible to reduce necessary resources compared with Embodiment 3. The pipelining time is given by max(required processing time for split information calculating unit 40, required processing time for second split information selecting unit 43+required processing time for generating unit 46)+required processing time for first split information selecting unit 41.

Further, the generating unit 46 generates binary data prior to the range information and the positional information. Thus, if time required for second split information selecting unit 43+time required for generating unit 46 exceeds time required for split information calculating unit 40, once the binary data generating unit 46a generates the nth binary data, the first split information selecting unit 41 can start the process of selecting the candidates for the split information corresponding to the (n+1)th binary data.

Embodiment 5

Figure 10:
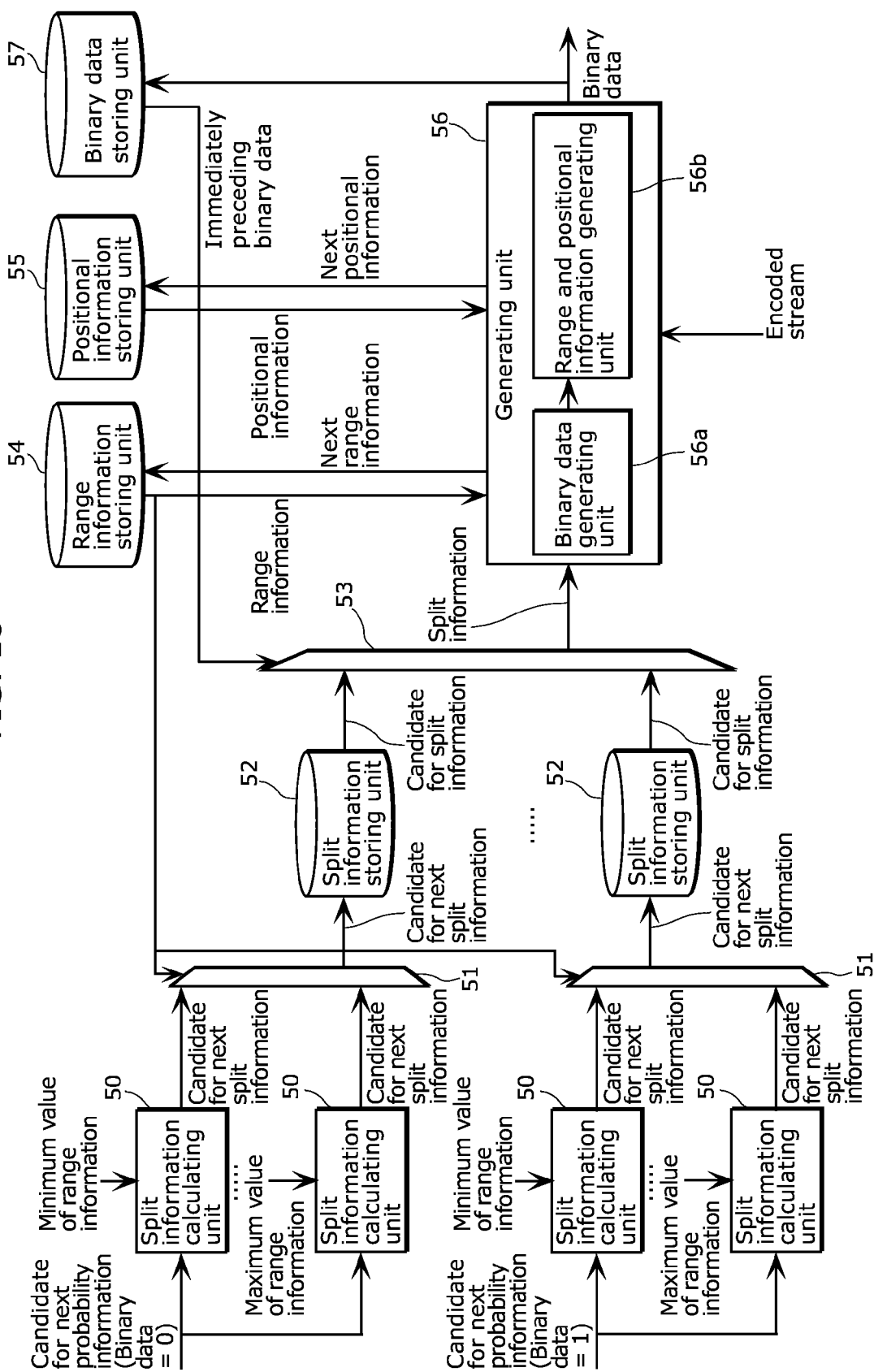
FIG. 10 is a block diagram illustrating a configuration of a binary arithmetic decoding unit according to Embodiment 5.

FIG. 10 is a block diagram illustrating a configuration of a binary arithmetic decoding unit 111b according to Embodiment 5 of the present disclosure. The binary arithmetic decoding unit 111b shown in FIG. 10 includes a split information calculating unit 50, a first split information selecting unit 51, a split information storing unit 52, a second split information selecting unit 53, a range information storing unit 54, a positional information storing unit 55, a generating unit 56 and a binary data storing unit 57. The generating unit 56 includes a binary data generating unit 56a and a range and positional information generating unit 56b.

Incidentally, individual structural components shown in FIG. 10 have common basic operations with the structural components in FIG. 2 having the same names. Thus, the description will be directed not to the common points but mainly to differences.

Since the split information calculating unit 50 is similar to the split information calculating unit 40 in FIG. 8, the description thereof will be omitted.

Based on the range information generated by the range and positional information generating unit 56b, the first split information selecting unit 51 selects part of candidates for the split information of which the split information calculating unit 50 has notified the first split information selecting unit 51 and causes the split information storing unit 52 to store that part. The range information used in the first split information selecting unit 51 is the next range information of which the range and positional information generating unit 56b notifies the first split information selecting unit 51.

The split information storing unit 52 stores the candidates for the split information selected by the first split information selecting unit 51. In other words, the candidates for the split information stored in the split information storing unit 52 are split information corresponding to the next range information among the candidates for the split information when the immediately preceding binary data takes a first value (0) and split information corresponding to the next range information among the candidates for the split information when the immediately preceding binary data takes a second value (1).

Based on the binary data calculated by the binary data generating unit 56a, the second split information selecting unit 53 selects any of the candidates for the split information stored in the split information storing unit 52 as the split information and notifies the generating unit 56 of that candidate. The binary data used in the second split information selecting unit 53 is the immediately preceding binary data stored in the binary data storing unit 57.

Based on the split information of which the second split information selecting unit 53 has notified the generating unit 56, the range information stored in the range information storing unit 54 and the positional information stored in the positional information storing unit 55, the generating unit 56 generates binary data and the range information and the positional information corresponding to the next binary data. Then, the generating unit 56 outputs the generated binary data while causing the binary data storing unit 57 to store the generated binary data, causes the range information storing unit 54 to store the generated range information while notifying the first split information selecting unit 51 of the generated range information, and causes the positional information storing unit 55 to store the generated positional information.

Figure 11A:
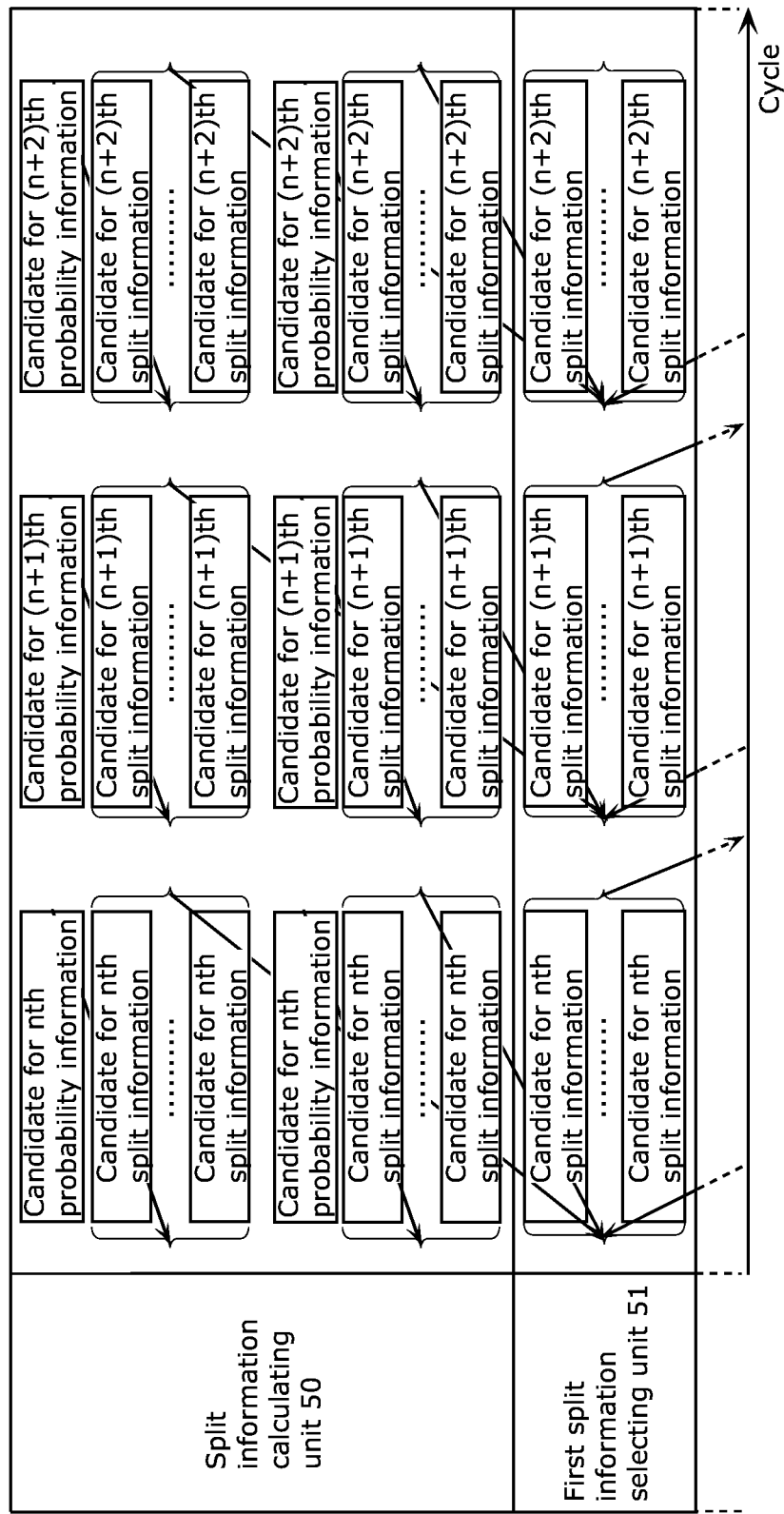
FIG. 11A is a conceptual diagram for describing an operation of the configuration shown in FIG. 10.
Figure 11B:
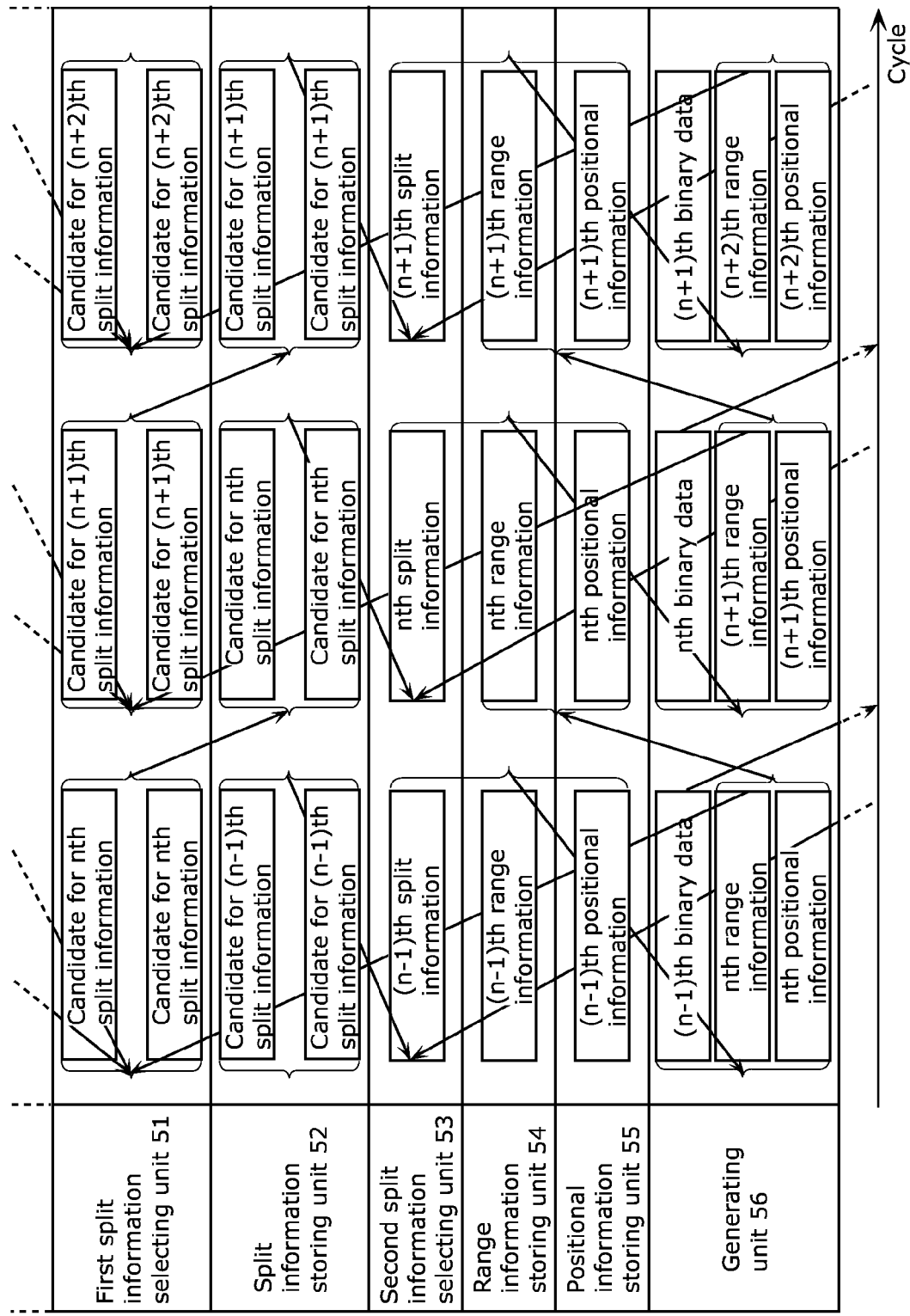
FIG. 11B is a conceptual diagram for describing the operation of the configuration shown in FIG. 10.
Figure 11C:
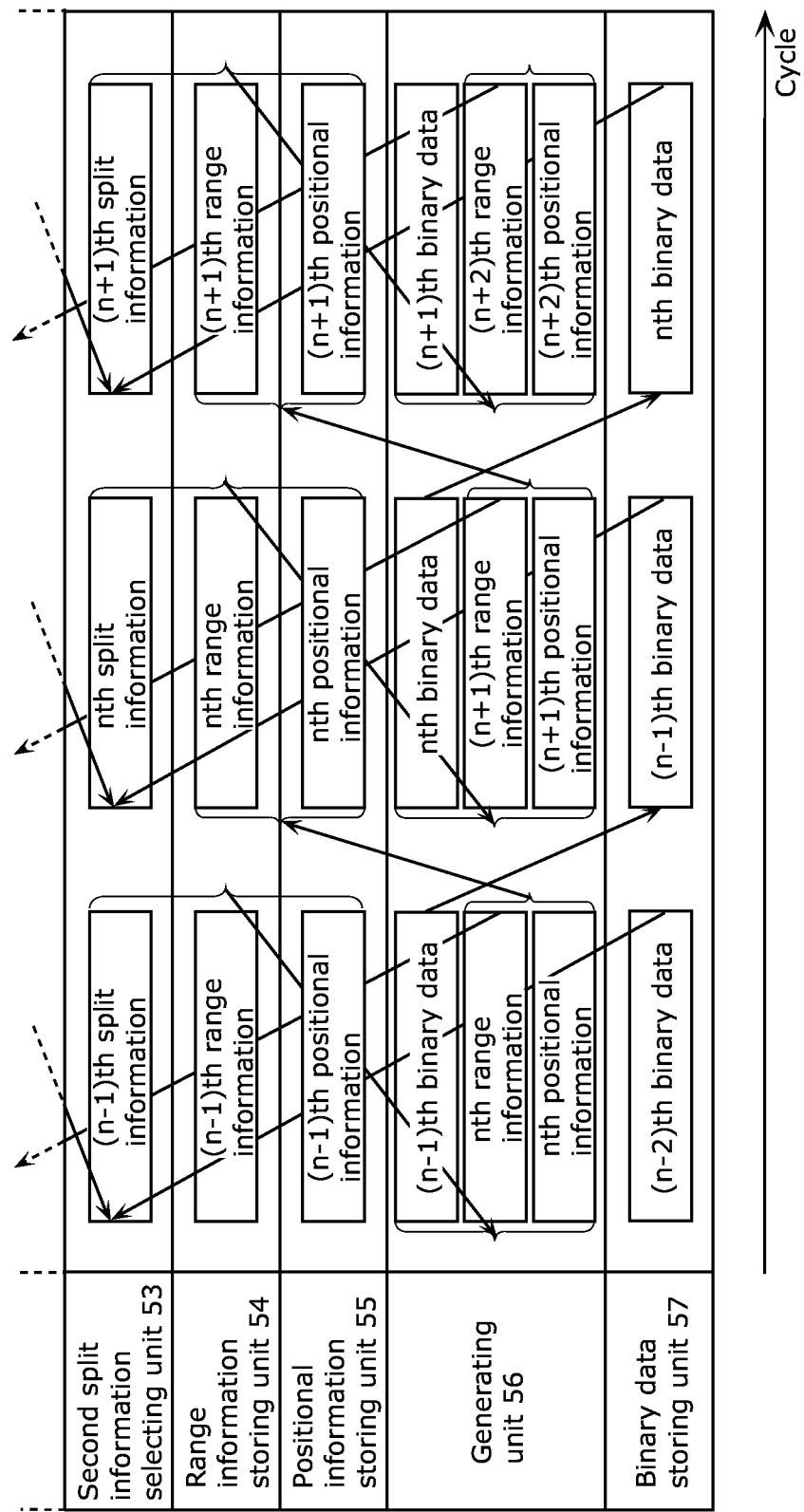
FIG. 11C is a conceptual diagram for describing the operation of the configuration shown in FIG. 10.

Now, referring to FIGS. 11A, 11B and 11C, the operation of the binary arithmetic decoding unit 111b according to Embodiment 5 will be described. FIGS. 11A, 11B and 11C are conceptual diagrams for describing the operation of the configuration shown in FIG. 10. It should be noted that the conceptual diagram for describing the operation of the configuration of FIG. 10 is divided into three figures, i.e., FIGS. 11A, 11B and 11C, where the first split information selecting unit 51, the second split information selecting unit 53, the range information storing unit 54, the positional information storing unit 55 and the generating unit 56 are redundant. Additionally, the timing chart shown in FIG. 9C also applies to Embodiment 5.

In accordance with FIGS. 11A, 11B and 11C, in a cycle where the generating unit 56 calculates the (n−1)th binary data, range information corresponding to the nth binary data and probability information corresponding to the nth binary data have not been determined. Thus, based on a range of the range information that could be generated by the range and positional information generating unit 56b, probability information corresponding to the nth binary data when the (n−1)th binary data takes 0 and probability information corresponding to the nth binary data when the (n−1)th binary data takes 1, the split information calculating unit 50 calculates a plurality of candidates for the split information corresponding to the nth binary data and notifies the first split information storing unit 51 of these candidates.

At this time, the generating unit 56 and the split information calculating unit 50 operate in parallel. Then, once the nth range information and the plurality of the candidates for the split information corresponding to the nth binary data are determined, the first split information selecting unit 51 selects part of the plurality of the candidates for the split information corresponding to the nth binary data of which the split information calculating unit 50 has notified the first split information selecting unit 51 based on the nth range information of which the range and positional information generating unit 56b has notified the first split information selecting unit 51, and causes the split information storing unit 52 to store that part.

Next, in a cycle where the generating unit 56 calculates the nth binary data, the (n−1)th binary data and the plurality of candidates for the split information corresponding to the nth binary data have been determined. Accordingly, based on the (n−1)th binary data stored in the binary data storing unit 57, the second split information selecting unit 53 selects as the split information any of the plurality of candidates for the split information that are stored in the split information storing unit 52 and correspond to the nth binary data and notifies the generating unit 56 of that split information. Based on the split information that corresponds to the nth binary data of which the second split information selecting unit 53 has notified the generating unit 56, and the range information and the positional information that are stored in the range information storing unit 54 and the positional information storing unit 55 and correspond to the nth binary data, the generating unit 56 generates the nth binary data and range information and positional information corresponding to the (n+1)th binary data.

As described above, since the binary arithmetic decoding unit 111b according to Embodiment 5 of the present disclosure needs to include only two split information storing units 52, it is possible to reduce necessary resources compared with Embodiment 4. The pipelining time is given by max (required processing time for split information calculating unit 50, required processing time for second split information selecting unit 53+required processing time for generating unit 56)+required processing time for first split information selecting unit 51.

Embodiment 6

Figure 12:
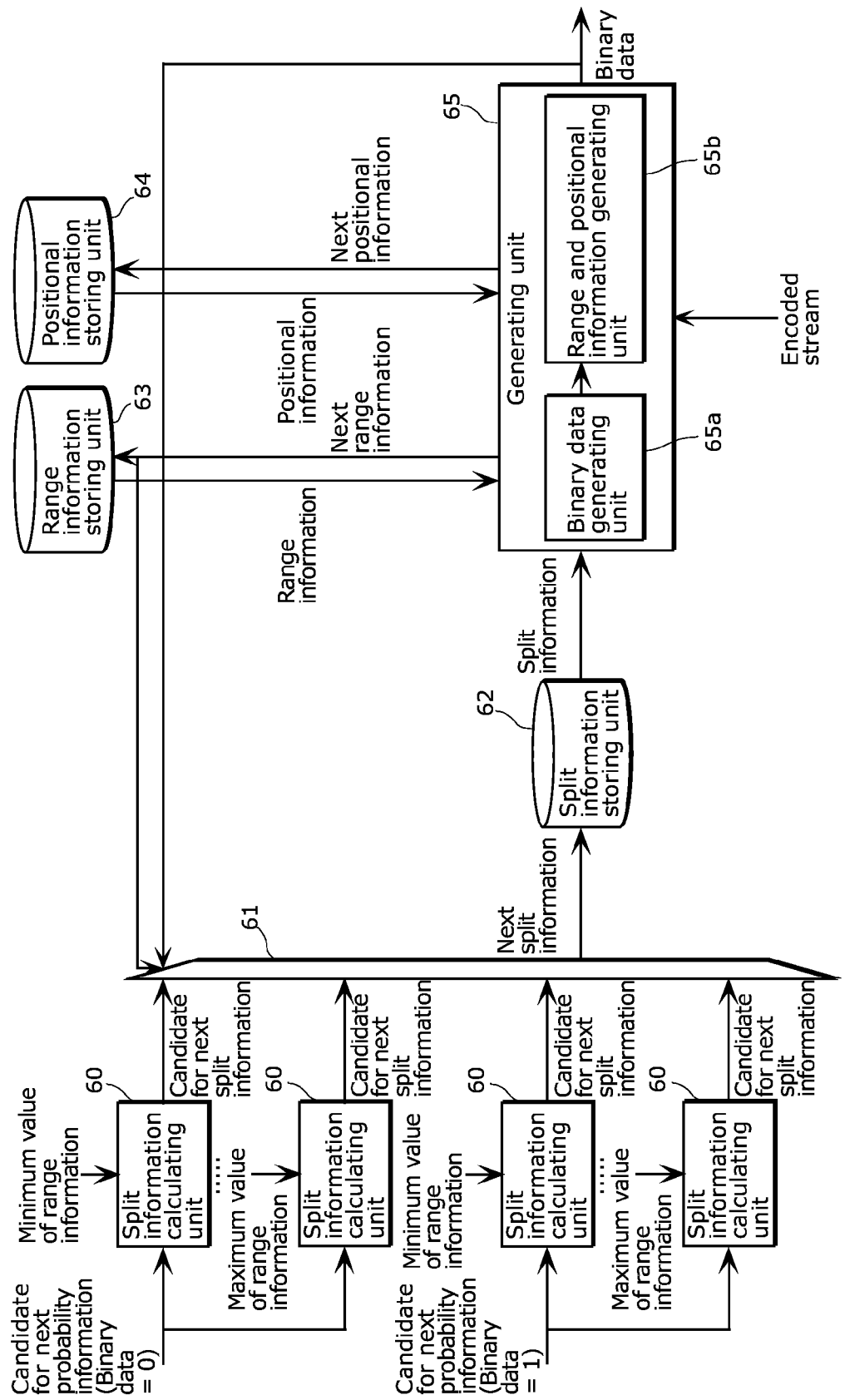
FIG. 12 is a block diagram illustrating a configuration of a binary arithmetic decoding unit according to Embodiment 6.

FIG. 12 is a block diagram illustrating a configuration of a binary arithmetic decoding unit 111b according to Embodiment 6 of the present disclosure. The binary arithmetic decoding unit 111b shown in FIG. 12 includes a split information calculating unit 60, a split information selecting unit 61, a split information storing unit 62, a range information storing unit 63, a positional information storing unit 64 and a generating unit 65. The generating unit 65 includes a binary data generating unit 65a and a range and positional information generating unit 65b. Incidentally, individual structural components shown in FIG. 12 have common basic operations with the structural components in FIG. 2 having the same names. Thus, the description will be directed not to the common points but mainly to differences.

Since the split information calculating unit 60 is similar to the split information calculating unit 40 in FIG. 8, the description thereof will be omitted.

Based on the range information and the binary data generated by the generating unit 65, the split information selecting unit 61 selects any of the candidates for the split information of which the split information calculating unit 60 has notified the split information selecting unit 61 as the split information and causes the split information storing unit 62 to store that candidate. The range information used in the split information selecting unit 61 is the next range information of which the range and positional information generating unit 65b notifies the split information selecting unit 61. The binary data used in the split information selecting unit 61 is the immediately preceding binary data of which the binary data generating unit 65a notifies the split information selecting unit 61.

The split information storing unit 62 stores the split information selected by the split information selecting unit 61. In other words, the split information storing unit 62 according to Embodiment 6 stores only one piece of the split information selected by the split information selecting unit 61, similarly to Embodiment 2.

Based on the split information stored in the split information storing unit 62, the range information stored in the range information storing unit 63 and the positional information stored in the positional information storing unit 64, the generating unit 65 generates binary data and the range information and the positional information corresponding to the next binary data. Then, the generating unit 65 outputs the generated binary data while notifying the split information selecting unit 61 of the generated binary data, causes the range information storing unit 63 to store the generated range information while notifying the split information selecting unit 61 of that range information, and causes the positional information storing unit 64 to store the generated positional information.

Figure 13A:
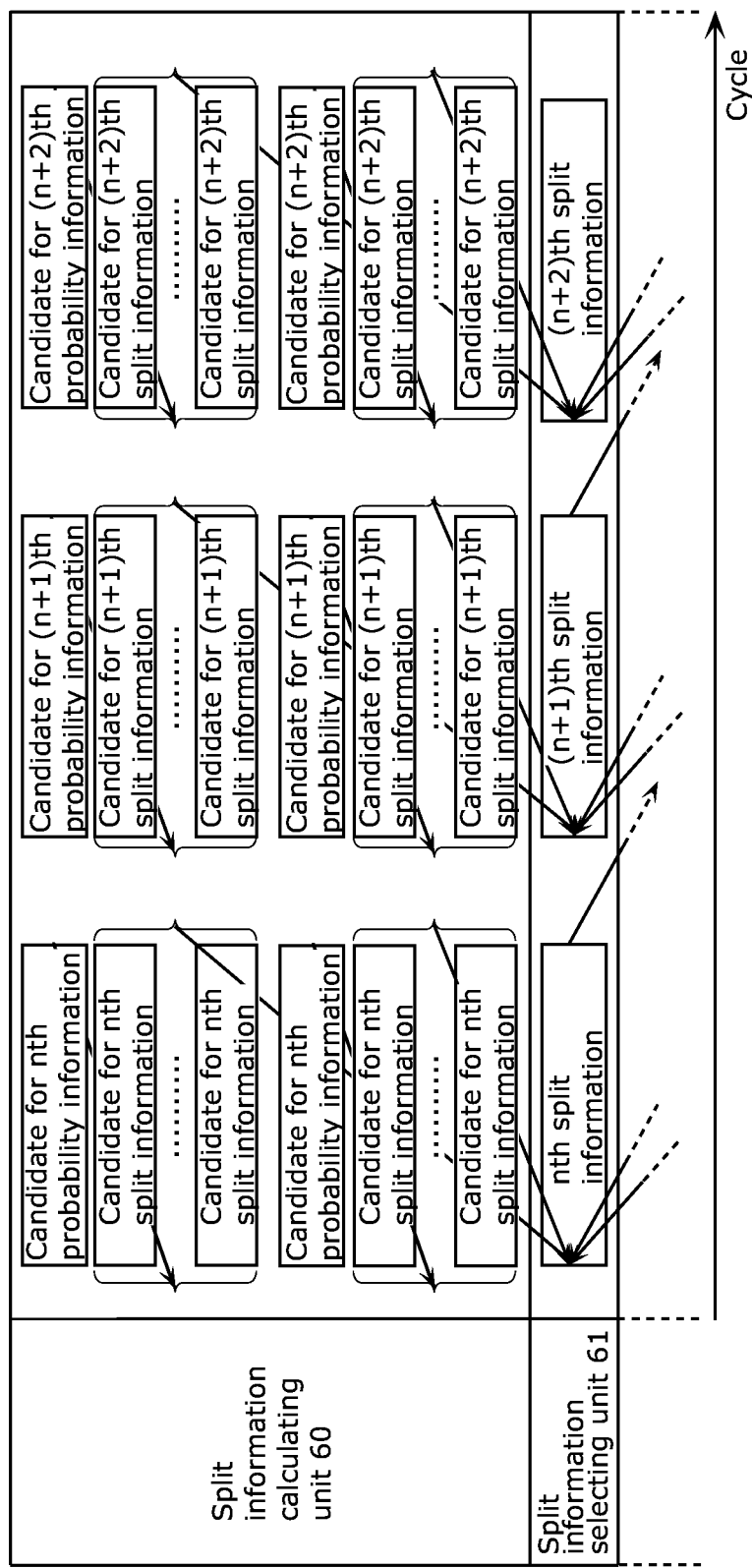
FIG. 13A is a conceptual diagram for describing an operation of the configuration shown in FIG. 12.
Figure 13B:
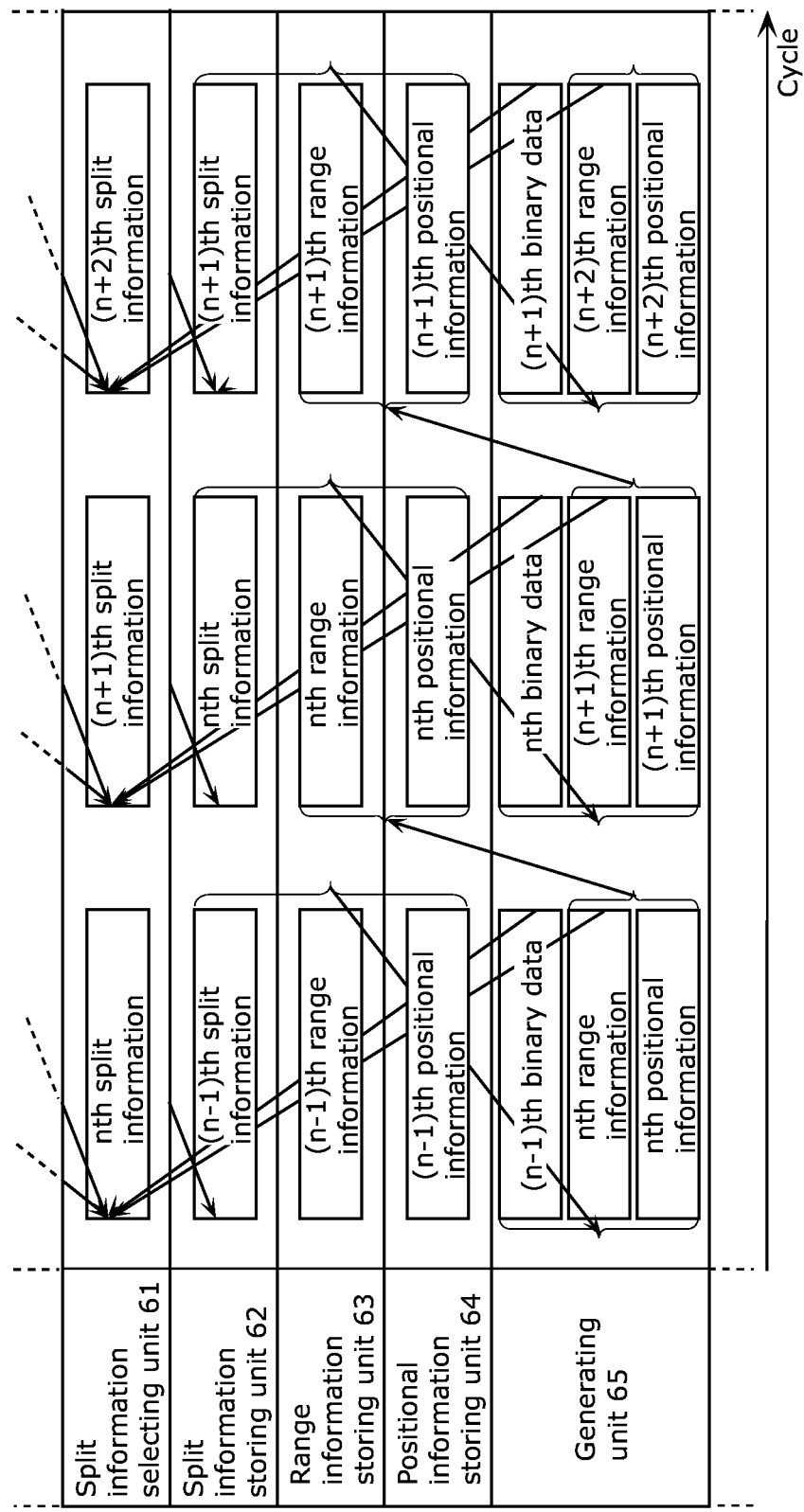
FIG. 13B is a conceptual diagram for describing the operation of the configuration shown in FIG. 12.
Figure 14:
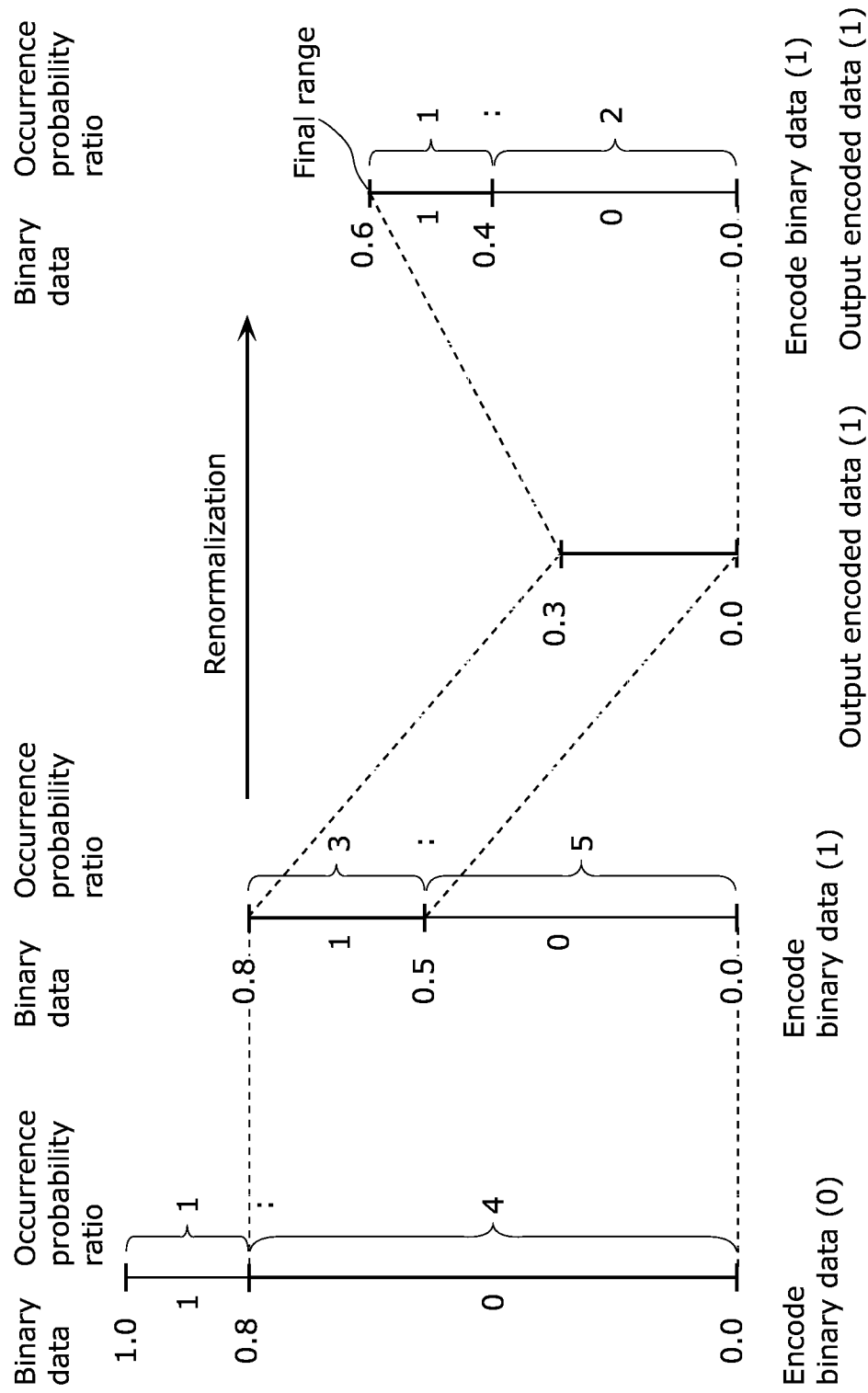
FIG. 14 is a conceptual diagram for describing a binary arithmetic encoding process.
Figure 15:
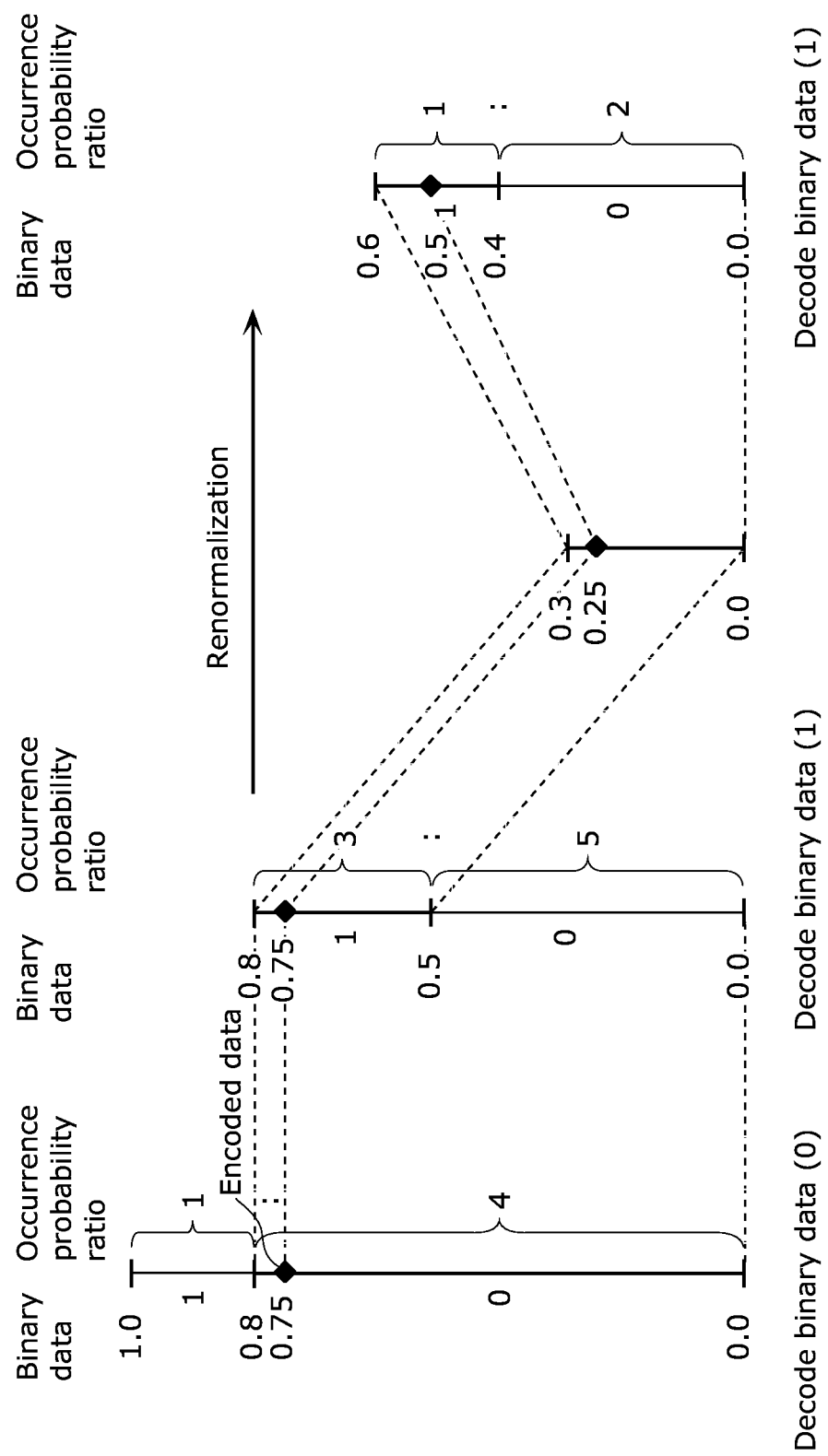
FIG. 15 is a conceptual diagram for describing a binary arithmetic decoding process.

Now, referring to FIGS. 13A and 13B, the operation of the binary arithmetic decoding unit 111b according to Embodiment 6 will be described. FIGS. 13A and 13B are conceptual diagrams for describing the operation of the configuration shown in FIG. 12. It should be noted that the conceptual diagram for describing the operation of the configuration of FIG. 12 is divided into two figures, i.e., FIG. 13A and FIG. 13B, where the split information selecting unit 61 is redundant. Additionally, the timing chart shown in FIG. 5C also applies to Embodiment 6.

According to FIGS. 13A and 13B, in a cycle where the generating unit 65 calculates the (n−1)th binary data, range information corresponding to the nth binary data and probability information corresponding to the nth binary data have not been determined. Thus, based on a range of the range information that could be generated by the range and positional information generating unit 65b, probability information corresponding to the nth binary data when the (n−1)th binary data takes 0 and probability information corresponding to the nth binary data when the (n−1)th binary data takes 1, the split information calculating unit 60 calculates a plurality of candidates for the split information corresponding to the nth binary data and notifies the split information storing unit 61 of these candidates.

At this time, the generating unit 65 and the split information calculating unit 60 operate in parallel. Then, once the range information corresponding to the nth binary data, the (n−1)th binary data and the plurality of the candidates for the split information corresponding to the nth binary data are determined, the split information selecting unit 61 selects as the split information any of the plurality of the candidates for the split information corresponding to the nth binary data of which the split information calculating unit 60 has notified the split information selecting unit 61 based on the range information corresponding to the nth binary data of which the range and positional information generating unit 65b has notified the split information selecting unit 61 and the (n−1)th binary data of which the binary data generating unit 65a has notified the first split information selecting unit 61, and causes the split information storing unit 62 to store that candidate.

Next, in a cycle where the generating unit 65 calculates the nth binary data, the split information corresponding to the nth binary data has been determined. Then, based on the split information that is stored in the split information storing unit 62 and corresponds to the nth binary data, and the range information and the positional information that are stored in the range information storing unit 63 and the positional information storing unit 64 and correspond to the nth binary data, the generating unit 65 generates the nth binary data and range information and positional information corresponding to the (n+1)th binary data.

As described above, since the binary arithmetic decoding unit 111b according to Embodiment 6 of the present disclosure needs to include only one split information storing units 62, it is possible to reduce necessary resources compared with Embodiment 5. The pipelining time is given by max (required processing time for split information calculating unit 60, required processing time for generating unit 65)+ required processing time for split information selecting unit 61.

Incidentally, the split information calculating units according to Embodiments 1 to 6 of the present disclosure may include a reference process or a multiplication process of a look-up table. The look-up table is a table holding probability information corresponding to each of the combinations of probability information and an upper limit of range information. At this time, by fixing the upper limit of the range information to be used in each split information calculating unit, it is possible to simplify the process of calculating the split information.

In the arithmetic decoding devices according to Embodiments 1 to 6 of the present disclosure, the process of calculating the probability information may be pipelined. In this way, it is possible to all pipeline the probability information calculating process and the binary arithmetic decoding process, pipeline processes in the probability information calculating process and pipeline processes in the binary arithmetic decoding process, thereby speeding up the entire arithmetic decoding process.

Note that, since any arithmetic encoding system requires the renormalization, the range of the range information is defined to be narrower than that of the positional information. Thus, when pipelining the binary arithmetic decoding process, it is possible to divide pipelining stages as shown in the arithmetic decoding devices according to Embodiments 1 to 6 of the present disclosure, thereby reducing the necessary resources considerably.

More specifically, the candidates for the split information are calculated by using the range of the range information instead of using the range of the positional information as input information, whereby it is necessary for the arithmetic decoding devices according to Embodiments 1 and 2 of the present disclosure to include only as many split information calculating units as corresponding ranges of the range information. In the arithmetic decoding devices according to Embodiments 3 to 6 of the present disclosure, it is necessary to provide only as twice as many split information calculating units as corresponding ranges of the range information.

Although the present disclosure has been described based on the embodiments above, it is needless to say that the present disclosure is not limited to these embodiments. The following cases will also fall within the scope of the present disclosure.

More specifically, each of the above-described devices is a computer system constituted by a microprocessor, a ROM, a RAM, a hard disk unit, a display unit, a keyboard, a mouse and so on. The RAM or the hard disk unit stores a computer program. The microprocessor operates according to the computer program, whereby each of the devices achieves its function. Here, the computer program is configured by combining a plurality of instruction codes issuing a command to a computer for achieving a predetermined function.

Part or all of the structural components constituting each of the above-described devices may be configured by a single system LSI (Large Scale Integration). The system LSI is a super-multifunctional LSI manufactured by integrating a plurality of structural components on a single chip and, more specifically, is a computer system configured by including a microprocessor, a ROM, a RAM and so on. The RAM stores a computer program. The microprocessor operates according to the computer program, whereby the system LSI achieves its function.

Part or all of the structural components constituting each of the above-described devices may be configured by an IC card, which can be attached and detached from each of the devices, or a stand-alone module. The IC card or the module is a computer system constituted by a microprocessor, a ROM, a RAM and so on. The IC card or the module may include the ultra-multifunctional LSI mentioned above. The microprocessor operates according to the computer program, whereby the IC card or the module achieves its function. This IC card or module may have a tamper resistance.

The present disclosure may include the method described above. Also, the present disclosure may include a computer program realizing such a method with a computer or may include a digital signal configured by the computer program.

Further, the present disclosure may record the computer program or the digital signal in a computer-readable recording medium, for example, a flexible disk, a hard disk, a CD-ROM, an MO, a DVD, a DVD-ROM, a DVD-RAM, a BD (Blu-ray Disc), a semiconductor memory or the like. Additionally, the present disclosure may include a digital signal that is recorded in such a recording medium.

Moreover, the present disclosure may transmit the computer program or the digital signal via a telecommunication line, a wireless or wired communication line, a network represented by the Internet, data broadcasting or the like.

Furthermore, the present disclosure may be a computer system including a microprocessor and a memory, in which the memory stores the computer program mentioned above and the microprocessor may operate according to the computer program.

In addition, by transferring a program or a digital signal recorded in a recording medium or by transferring a program or a digital signal via a network, the present disclosure may be implemented with another independent computer system.

The above-described embodiments and the above-described variations may be combined individually.

The above description has been directed to embodiments of the present disclosure with reference to accompanying drawings. However, the present disclosure is by no means limited to the embodiments illustrated in the figures. The illustrated embodiments can be modified or varied in many ways within the scope identical with or equivalent to the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to an arithmetic decoding device, in particular, as a device for decoding moving pictures or sound to be realized by an electronic circuit such as an LSI. For example, the present disclosure is useful as a device for decoding moving pictures or sound provided in a personal computer, a digital television, a DVD (Digital Versatile Disc) player, a DVD recorder, a BD (Blu-ray Disc) player, a BD recorder, a PDA (Personal Digital Assistant), a mobile phone, etc. that decodes and reproduces encoded moving pictures or sound.

The invention claimed is:

1. A decoding device that decodes an encoded stream to generate binary data item by item sequentially, the device comprising:
a split information calculating unit that calculates a plurality of candidates for split information using probability information, the plurality of candidates for split information indicating respective boundaries for splitting a plurality of ranges into a range of a first value and a range of a second value, the plurality of ranges being indicated by a plurality of pieces of range information that can be generated based on an immediately preceding item of the binary data, the probability information indicating a ratio between a probability of a current item of the binary data generated based on positional information taking the first value and a probability of the current item of the binary data taking the second value, and the plurality of pieces of range information each indicating a possible range of the positional information indicating a position of encoded data obtained from the stream;
a split information selecting unit that selects, from among the plurality of candidates for the split information, the split information corresponding to one of the plurality of pieces of range information generated based on the immediately preceding item of the binary data; and
a generating unit that generates the current item of the binary data according to which of the range of the first value and the range of the second value divided at the boundary indicated by the split information selected by the split information selecting unit includes the position indicated by the positional information and generates a next piece of range information and a next piece of the positional information using the generated current item of the binary data,
wherein a process of the split information calculating unit and a process of the generating unit are pipelined.

2. The decoding device according to claim 1, further comprising:
a split information storing unit that stores the plurality of candidates for the split information that are calculated by the split information calculating unit;
a range information storing unit that stores range information that is generated by the generating unit; and
a positional information storing unit that stores positional information that is generated by the generating unit,
wherein the split information selecting unit selects an nth piece of split information corresponding to an nth piece of range information stored in the range information storing unit, from among the plurality of candidates for the nth piece of split information stored in the split information storing unit and notifies the generating unit of the nth piece of split information, and
the generating unit generates an nth item of the binary data, an (n+1)th piece of range information and an (n+1)th piece of positional information using the nth piece of split information of which the split information selecting unit has notified the generating unit, the nth piece of range information stored in the range information storing unit and an nth piece of positional information stored in the positional information storing unit.

3. The decoding device according to claim 1, further comprising:
a split information storing unit that stores the split information that is selected by the split information selecting unit;
a range information storing unit that stores range information that is generated by the generating unit; and
a positional information storing unit that stores positional information that is generated by the generating unit,
wherein the split information selecting unit selects an nth piece of split information corresponding to an nth piece of range information stored in the range information storing unit, from among the plurality of candidates for the nth piece of split information calculated by the split information calculating unit and causes the split information storing unit to store the nth piece of split information, and
the generating unit generates an nth item of the binary data, an (n+1)th piece of range information and an (n+1)th piece of positional information using the nth piece of split information stored in the split information storing unit, the nth piece of range information stored in the range information storing unit and an nth piece of positional information stored in the positional information storing unit.

4. The decoding device according to claim 1,
wherein the split information calculating unit calculates the plurality of candidates for the split information, using the probability information when an immediately preceding item of the binary data takes the first value and the probability information when the immediately preceding item of the binary data takes the second value, and
the split information selecting unit selects the split information corresponding to one of the plurality of range information from among the plurality of candidates for split information calculated using the probability information corresponding to the immediately preceding item of the binary data generated by the generating unit.

5. The decoding device according to claim 4, further comprising:

a split information storing unit that stores the plurality of candidates for split information that are calculated by the split information calculating unit;
a range information storing unit that stores range information that is generated by the generating unit;
a positional information storing unit that stores positional information that is generated by the generating unit; and
a binary data storing unit that stores the binary data that is generated by the generating unit,
wherein the split information selecting unit selects an nth piece of split information corresponding to an (n−1)th item of the binary data stored in the binary data storing unit and an nth piece of range information stored in the range information storing unit, from among the plurality of candidates for the nth piece of split information stored in the split information storing unit and notifies the generating unit of the nth piece of split information, and
the generating unit generates an nth item of the binary data, an (n+1)th piece of range information and an (n+1)th piece of positional information using the nth piece of split information of which the split information selecting unit has notified the generating unit, the nth piece of range information stored in the range information storing unit and an nth piece of positional information stored in the positional information storing unit.

6. The decoding device according to claim 4, further comprising:
a split information storing unit that stores the plurality of candidates for the split information;
a range information storing unit that stores range information that is generated by the generating unit; and
a positional information storing unit that stores positional information that is generated by the generating unit,
wherein the split information selecting unit includes
a first split information selecting unit that selects a candidate for split information corresponding to an (n−1)th item of the binary data generated by the generating unit from among the plurality of candidates for an nth piece of split information calculated by the split information calculating unit and causes the split information storing unit to store the candidate, and
a second split information selecting unit that selects the nth piece of split information corresponding to an nth piece of range information stored in the range information storing unit, from among the plurality of candidates for the split information stored in split information storing unit and notifies the generating unit of the nth piece of split information, and
the generating unit generates an nth item of the binary data, an (n+1)th piece of range information and an (n+1)th piece of positional information using the nth piece of split information of which the second split information selecting unit has notified the generating unit, the nth piece of range information stored in the range information storing unit and an nth piece of positional information stored in the positional information storing unit.

7. The decoding device according to claim 4, further comprising:
a split information storing unit that stores the plurality of candidates for the split information;
a binary data storing unit that stores the binary data that is generated by the generating unit;
a range information storing unit that stores range information that is generated by the generating unit; and
a positional information storing unit that stores positional information that is generated by the generating unit,
wherein the split information selecting unit includes:
a first split information selecting unit that selects a candidate for the split information corresponding to an nth piece of range information stored in the range information storing unit from among the plurality of candidates for an nth piece of split information calculated by the split information calculating unit and causes the split information storing unit to store the candidate, and
a second split information selecting unit that selects the nth piece of split information corresponding to an (n−1)th item of the binary data stored in the binary data storing unit, from among the plurality of candidates for split information stored in the split information storing unit and notifies the generating unit of the nth piece of the split information, and
the generating unit generates an nth item of the binary data, an (n+1)th piece of range information and an (n+1)th piece of positional information using the nth piece of split information of which the second split information selecting unit has notified the generating unit, the nth piece of range information stored in the range information storing unit and an nth piece of positional information stored in the positional information storing unit.

8. The decoding device according to claim 4, further comprising:
a split information storing unit that stores the split information;
a range information storing unit that stores range information that is generated by the generating unit; and
a positional information storing unit that stores positional information that is generated by the generating unit,
wherein the split information selecting unit selects an nth piece of split information corresponding to an (n−1)th item of the binary data and an nth piece of range information calculated by the split information calculating unit, from among the plurality of candidates for the nth piece of split information calculated by the split information calculating unit and causes the split information storing unit to store the nth piece of split information, and
the generating unit generates an nth item of the binary data, an (n+1)th piece of range information and an (n+1)th piece of positional information using the nth piece of split information stored in the split information storing unit, the nth piece of range information stored in the range information storing unit and an nth piece of positional information stored in the positional information storing unit.

9. The decoding device according to claim 1,
wherein the split information calculating unit calculates the plurality of candidates for split information by referring to a look-up table, which holds probability information corresponding to a combination of the probability information and an upper limit of the range information.

10. The decoding device according to claim 9,
wherein the split information calculating unit comprises a plurality of split information calculating units, and
each of the plurality of split information calculating units calculates the plurality of candidates for split informa- 11. The decoding device according to claim 1,
wherein the split information calculating unit calculates the plurality of candidates for split information by a multiplication process of the probability information and an upper limit of the plurality of pieces of range information.

12. The decoding device according to claim 11,
wherein the split information calculating unit comprises a plurality of split information calculating units, and
each of the plurality of split information calculating units calculates the plurality of candidates for split information by the multiplication process in which the upper limit of the plurality of pieces of range information is fixed.

13. The decoding device according to claim 1, further comprising
a probability information calculating unit that calculates the probability information used in the split information selecting unit.

14. An image decoding apparatus that generates an image from binary data obtained by decoding an encoded stream, the image decoding apparatus comprising:
the decoding device according to claim 1.

15. The decoding device according to claim 1,
wherein the process of the split information calculating unit and the process of the generating unit are pipelined such that (i) calculation of the plurality of candidates for split information for a next item of the binary data and (ii) generation of the current item of the binary data and generation of the next piece of range information and the next piece of positional information are performed in a same cycle.

16. A decoding device that decodes an encoded stream to generate binary data item by item sequentially, the device comprising:
a range information storing unit that stores a plurality pieces of range information each indicating a possible range of positional information indicating a position of encoded data obtained from the stream;
a positional information storing unit that stores the positional information;
a binary data storing unit that stores the binary data;
a split information storing unit that stores a plurality of candidates for split information, the plurality of candidates for split information indicating respective boundaries for splitting a plurality of ranges into a range of a first value and a range of a second value, the plurality of ranges being indicated by the plurality of pieces of range information that can be generated based on an immediately preceding item of the binary data;
a split information calculating unit;
a split information selecting unit;
a binary data generating unit; and
a range and positional information generating unit,
wherein the split information calculating unit calculates the plurality of candidates for split information using probability information and causes the split information storing unit to store the plurality of candidates, the probability information indicating a ratio between a probability of a current item of the binary data generated based on positional information taking the first value and a probability of the current item of the binary data taking the second value,
the split information selecting unit selects, from among the plurality of candidates for split information stored in the split information storing unit, the split information corresponding to one of the plurality pieces of range information generated based on the immediately preceding item of the binary data and stored in the range information storing unit and notifies the binary data generating unit of the selected split information,
the binary data generating unit generates the current item of the binary data according to which of the range of the first value and the range of the second value divided at a boundary indicated by the split information selected by the split information selecting unit includes the position indicated by the positional information, using the split information of which the split information selecting unit has notified the binary data generating unit, the plurality pieces of range information stored in the range information storing unit and the positional information stored in the positional information storing unit, and causes the binary data storing unit to store the binary data, and
the range and positional information generating unit generates the plurality pieces of range information and the positional information using the current item of binary data generated by the binary data generating unit and causes the range information storing unit and the positional information storing unit to store the plurality pieces of range information and the positional information.

17. A decoding device that decodes an encoded stream to generate binary data item by item sequentially, the device comprising:
a range information storing unit that stores a plurality pieces of range information each indicating a possible range of positional information indicating a position of encoded data obtained from the stream;
a positional information storing unit that stores the positional information;
a split information storing unit that stores a plurality of candidates for split information, the plurality of candidates for split information indicating respective boundaries for splitting a plurality of ranges into a range of a first value and a range of a second value, the plurality of ranges being indicated by the plurality of pieces of range information that can be generated based on an immediately preceding item of the binary data;
a split information calculating unit;
a first split information selecting unit;
a second split information selecting unit;
a binary data generating unit; and
a range and positional information generating unit,
wherein the split information calculating unit calculates the plurality of candidates for split information using probability information and to notify notifies the first split information selecting unit of the plurality of candidates, the probability information indicating a ratio between a probability of a current item of the binary data generated based on positional information taking the first value and a probability of the current item of the binary data taking the second value,
the first split information selecting unit selects a candidate for split information corresponding to an immediately preceding item of the binary data generated by the binary data generating unit, from among the plurality of candidates for split information of which the split information calculating unit has notified the first split information selecting unit and causes the split information storing unit to store the candidate, the second split information selecting unit that selects the split information corresponding to one of the plurality of pieces of range information stored in the range information storing unit, from among the plurality of candidates for split information stored in the split information storing unit and notifies the binary data generating unit of the selected split information, the binary data generating unit generates the current item of the binary data according to which of the range of the first value and the range of the second values divided at a boundary indicated by the split information selected by the split information selecting unit includes the position indicated by the positional information, using the split information of which the second split information selecting unit has notified the binary data generating unit, the range information stored in the range information storing unit and the positional information stored in the positional information storing unit, and notifies the first split information selecting unit of the current item of the binary data, and the range and positional information generating unit generates the plurality pieces of range information and the positional information using the current item of the binary data generated by the binary data generating unit and causes the range information storing unit and the positional information storing unit to store the plurality pieces of range information and the positional information.

18. A decoding device that decodes an encoded stream to generate binary data item by item sequentially, the device comprising:

a range information storing unit that stores a plurality of pieces of range information each indicating a possible range of positional information indicating a position of encoded data obtained from the stream;

a positional information storing unit that stores the positional information;

a binary data storing unit that stores the binary data;

a split information storing unit that stores a plurality of candidates for split information, the split information indicating respective boundaries for splitting a plurality of ranges into a range of a first value and a range of a second value, the plurality of ranges being indicated by a plurality of pieces of range information that can be generated based on an immediately preceding item of the binary data;

a split information calculating unit;

a first split information selecting unit;

a second split information selecting unit;

a binary data generating unit; and a range and positional information generating unit, wherein the split information calculating unit calculates the plurality of candidates for split information using probability information and notifies the first split information selecting unit of the plurality of candidates, the probability information indicating a ratio between a probability of a current item of the binary data generated based on positional information taking the first value and a probability of the current item of the binary data taking the second value, the first split information selecting unit selects a candidate for split information corresponding to one of the plurality of pieces of range information stored in the range information storing unit, from among the plurality of candidates for split information of which the split information calculating unit has notified the first split information selecting unit and to cause the split information storing unit to store the candidate, the second split information selecting unit is configured to select the split information corresponding to the binary data stored in the binary data storing unit, from among the plurality of candidates for split information stored in the split information storing unit and notifies the binary data generating unit of the selected split information, the binary data generating unit that generates the current item of the binary data according to which of the range of the first value and the range of the second value divided at the boundary indicated by the split information selected by the split information selecting unit includes the position indicated by the positional information, using the split information of which the second split information selecting unit has notified the binary data generating unit, the plurality of pieces of range information stored in the range information storing unit and the positional information stored in the positional information storing unit, and causes the binary data storing unit to store the current item of the binary data, and the range and positional information generating unit generates the plurality of pieces of range information and the positional information using the current item of binary data generated by the binary data generating unit and causes the range information storing unit and the positional information storing unit to store the range information and the positional information.

19. A decoding method of decoding an encoded stream to generate binary data item by item sequentially, the method comprising:

calculating a plurality of candidates for split information using probability information, the plurality of candidate for split information indicating respective boundaries for splitting a plurality of ranges into a range of a first value and a range of a second value, the probability information indicating a ratio between a probability of a current item of the binary data generated based on positional information taking the first value and a probability of the current item of the binary data taking the second value, and the plurality of ranges being indicated by a plurality of pieces of range information that can be generated based on an immediately preceding item of the binary data, and the plurality of pieces of range information each indicating a possible range of the positional information indicating a position of encoded data obtained from the stream;

selecting, from among the plurality of candidate for split information, the split information corresponding to one of the plurality of pieces of the range information generated based on the immediately preceding item of the binary data; and generating the current item of the binary data according to which of the range of the first value and the range of the second value divided at the boundary indicated by the split information includes the position indicated by the positional information, and a next piece of the range information and a next piece of the positional information using the generated current item of the binary data, wherein the calculating and the generating are pipelined.

* * * * *